(12) United States Patent
Kim et al.

(10) Patent No.: US 10,229,876 B2
(45) Date of Patent: Mar. 12, 2019

(54) WIRING STRUCTURES AND SEMICONDUCTOR DEVICES

(71) Applicants: Jun-Jung Kim, Suwon-si (KR);
Young-Bae Kim, Yongin-si (KR);
Jong-Sam Kim, Hwaseong-si (KR);
Jin-Hyeung Park, Suwon-si (KR);
Jeong-Hoon Ahn, Yongin-si (KR);
Hyeok-Sang Oh, Suwon-si (KR);
Kyoung-Woo Lee, Hwaseong-si (KR);
Hyo-Seon Lee, Yongin-si (KR);
Suk-Hee Jang, Suwon-si (KR)

(72) Inventors: Jun-Jung Kim, Suwon-si (KR);
Young-Bae Kim, Yongin-si (KR);
Jong-Sam Kim, Hwaseong-si (KR);
Jin-Hyeung Park, Suwon-si (KR);
Jeong-Hoon Ahn, Yongin-si (KR);
Hyeok-Sang Oh, Suwon-si (KR);
Kyoung-Woo Lee, Hwaseong-si (KR);
Hyo-Seon Lee, Yongin-si (KR);
Suk-Hee Jang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/073,640

(22) Filed: Mar. 17, 2016

(65) Prior Publication Data
US 2016/0343660 A1    Nov. 24, 2016

(30) Foreign Application Priority Data
May 19, 2015    (KR) .................. 10-2015-0069754

(51) Int. Cl.
*H01L 23/535*    (2006.01)
*H01L 23/528*    (2006.01)
(Continued)

(52) U.S. Cl.
CPC .... *H01L 23/5226* (2013.01); *H01L 21/76802* (2013.01); *H01L 21/76807* (2013.01);
(Continued)

(58) Field of Classification Search
CPC . H01L 23/535; H01L 23/528; H01L 23/5226; H01L 27/088; H01L 23/53295;
(Continued)

(56) References Cited

U.S. PATENT DOCUMENTS 6,143,638 A * 11/2000 Bohr ................. H01L 21/02164
257/E21.279
6,207,574 B1 * 3/2001 Lee ................... H01L 21/76895
117/8

(Continued)

FOREIGN PATENT DOCUMENTS

| JP | 11168142 | 6/1999 |
|---|---|---|
| JP | 2002252184 A | 9/2002 |
| KR | 20080099615 A | 11/2008 |

*Primary Examiner* — Cuong Q Nguyen
*Assistant Examiner* — Tong-Ho Kim
(74) *Attorney, Agent, or Firm* — Renaissance IP Law Group LLP

(57) ABSTRACT

A wiring structure includes a substrate, a lower insulation layer on the substrate, a lower wiring in the lower insulation layer, a first etch-stop layer covering the lower wiring and including a metallic dielectric material, a second etch-stop layer on the first etch-stop layer and the lower insulation layer, an insulating interlayer on the second etch-stop layer, and a conductive pattern extending through the insulating interlayer, the second etch-stop layer and the first etch-stop layer and electrically connected to the lower wiring.

20 Claims, 37 Drawing Sheets

(51) Int. Cl.
  *H01L 23/522*  (2006.01)
  *H01L 27/088*  (2006.01)
  *H01L 23/532*  (2006.01)
  *H01L 21/768*  (2006.01)
  *H01L 21/8234* (2006.01)
  *H01L 23/485*  (2006.01)

(52) U.S. Cl.
  CPC .. *H01L 21/76832* (2013.01); *H01L 21/76834* (2013.01); *H01L 23/53295* (2013.01); *H01L 21/76873* (2013.01); *H01L 21/76882* (2013.01); *H01L 21/823475* (2013.01); *H01L 23/485* (2013.01); *H01L 27/088* (2013.01)

(58) Field of Classification Search
  CPC ............. H01L 23/485; H01L 21/76802; H01L 21/76807; H01L 21/76832; H01L 21/76834; H01L 21/823475; H01L 21/76873; H01L 21/76882
  USPC .......................................... 257/401; 438/612
  See application file for complete search history.

(56) References Cited

U.S. PATENT DOCUMENTS

| | | | |
|---|---|---|---|
| 6,562,711 B1* | 5/2003 | Powers | H01L 21/76802 |
| | | | 257/E21.576 |
| 6,613,684 B2 | 9/2003 | Fujimoto | |
| 7,187,038 B2 | 3/2007 | Morin et al. | |
| 7,205,223 B2 | 4/2007 | McTeer | |
| 7,679,193 B2 | 3/2010 | McTeer | |
| 8,384,217 B2 | 2/2013 | Streck et al. | |
| 9,041,216 B2 | 5/2015 | Sung et al. | |
| 2001/0005625 A1* | 6/2001 | Sun | H01L 21/76802 |
| | | | 438/634 |
| 2005/0074959 A1* | 4/2005 | Burrell | H01L 23/3192 |
| | | | 438/617 |
| 2007/0013070 A1 | 1/2007 | Liang et al. | |
| 2010/0252930 A1* | 10/2010 | Liao | H01L 21/76807 |
| | | | 257/762 |
| 2014/0264926 A1* | 9/2014 | Wu | H01L 21/76802 |
| | | | 257/774 |
| 2015/0102461 A1* | 4/2015 | Lee | H01L 27/10814 |
| | | | 257/532 |

* cited by examiner

_US 10,229,876 B2_

WIRING STRUCTURES AND SEMICONDUCTOR DEVICES

CROSS-REFERENCE TO RELATED APPLICATION

This application claims priority under 35 USC § 119 to Korean Patent Application No. 10-2015-0069754, filed on May 19, 2015 in the Korean Intellectual Property Office (KIPO), the contents of which are incorporated by reference herein in their entirety.

TECHNICAL FIELD

Example embodiments disclosed herein relate to wiring structures, methods of forming wiring structures and semiconductor devices. More particularly, example embodiments disclosed herein relate to wiring structures including an insulation structure and a conductive pattern, methods of forming such wiring structures and semiconductor devices including such wiring structures.

BACKGROUND

In a semiconductor device, a wiring structure used for interconnection, such as a via structure or a contact, may be formed so that signal lines at different levels may be electrically connected to each other. For example, an opening through which a lower conductive pattern is exposed may be formed, and a metal layer may be deposited in the opening to form a conductive pattern. However, as a degree of integration of the semiconductor device increases, structures or elements adjacent to the conductive pattern may be damaged while forming the conductive pattern.

SUMMARY

Example embodiments discussed herein provide wiring structures having improved electrical and structural reliability, and methods of forming such wiring structures. Example embodiments discussed herein also provide semiconductor devices including such wiring structures.

According to example embodiments, there is provided a wiring structure. The wiring structure may include a substrate, a lower insulation layer on the substrate, a lower wiring in the lower insulation layer, and a multi-layered etch-stop layer covering the lower wiring and the lower insulation layer, wherein a thickness of the multi-layered etch-stop layer over the lower wiring is greater than a thickness of the multi-layered etch-stop layer over the lower insulation layer. The multi-layered etch-stop layer may include a first etch-stop layer covering the lower wiring and including a metallic dielectric material, and a second etch-stop layer on the first etch-stop layer and the lower insulation layer. The wiring structure may further include an insulating interlayer on the second etch-stop layer and a conductive pattern extending through the insulating interlayer, the second etch-stop layer and the first etch-stop layer and electrically connected to the lower wiring.

According to other example embodiments, there is provided a wiring structure. The wiring structure may include a substrate, a lower insulation layer on the substrate, a lower wiring in the lower insulation layer and a first etch-stop layer covering the lower wiring and the lower insulation layer. The first etch-stop layer may be relatively thicker on the lower wiring as compared to the lower insulation layer. The wiring structure may also include a second etch-stop layer on the first etch-stop layer, and include a material that is different from that of the first etch-stop layer. The wiring structure may also include an insulating interlayer on the second etch-stop layer and a conductive pattern extending through the insulating interlayer, the second etch-stop layer and the first etch-stop layer and electrically connected to the lower wiring.

According to example embodiments, there is provided a method of forming a wiring structure. In the method, a lower insulation layer may be formed on a substrate. A lower wiring may be formed in the lower insulation layer. A multi-layered etch-stop layer may be formed to cover the lower wiring and the lower insulation layer such that a thickness of the multi-layered etch-stop layer over the lower wiring is greater than a thickness of the multi-layered etch-stop layer over the lower insulation layer. The multi-layered etch-stop layer may be formed by forming a first etch-stop layer including a metallic dielectric material on the lower wiring and forming a second etch-stop layer including a non-metallic dielectric material on the first etch-stop layer. An insulating interlayer may be formed on the second etch-stop layer. A conductive pattern may be formed through the insulating interlayer, the second etch-stop layer and the first etch-stop layer such that the conductive pattern may be electrically connected to the lower wiring.

According to example embodiments, there is provided a semiconductor device. The semiconductor device may include a plurality of active patterns defined by an isolation layer, a gate structure on the active patterns, a source/drain layer formed at an upper portion of the active patterns adjacent to the gate structure, a lower insulation layer on the gate structure and the active patterns and a lower wiring electrically connected to the source/drain layer in the lower insulation layer. The semiconductor device may also include a multi-layered etch-stop layer covering the lower wiring and the lower insulation layer, wherein a thickness of the multi-layered etch-stop layer over the lower wiring may be greater than a thickness of the multi-layered etch-stop layer over the lower insulation layer. The multi-layered etch-stop layer may include a first etch-stop layer covering the lower wiring and including a metallic dielectric material and a second etch-stop layer on the first etch-stop layer and the lower insulation layer. The semiconductor device may also include an insulating interlayer on the second etch-stop layer and a conductive pattern extending through the insulating interlayer, the second etch-stop layer and the first etch-stop layer and electrically connected to the lower wiring.

BRIEF DESCRIPTION OF THE DRAWINGS

Example embodiments will be more clearly understood from the following detailed description taken in conjunction with the accompanying drawings.

FIGS. 1 to 8 are cross-sectional views illustrating a method of forming a wiring structure in accordance with some example embodiments;

FIGS. 30 to 54 are cross-sectional views illustrating a method of manufacturing a semiconductor device in accordance with some example embodiments.

DESCRIPTION OF EMBODIMENTS

Figure 1:
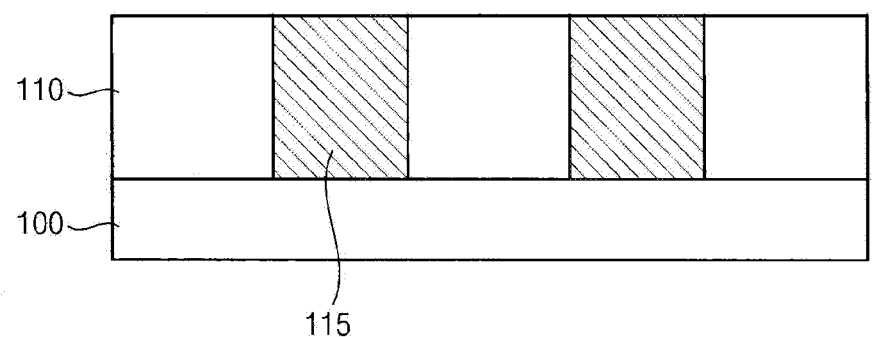
FIGS. 1 to 54 represent non-limiting, example embodiments as described herein.

Various example embodiments will be described more fully hereinafter with reference to the accompanying drawings, in which some example embodiments are shown. These embodiments may, however, be realized in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 8 are cross-sectional views illustrating a method of forming a wiring structure in accordance with some example embodiments.

Referring to FIG. 1, a lower structure including a lower insulation layer 110 and a lower wiring 115 may be formed on a substrate 100. The substrate 100 may include a silicon (Si) substrate, a germanium (Ge) substrate, a Si—Ge substrate, or the like. In one embodiment, the substrate 100 may be provided as a silicon-on-insulator (SOI) substrate, a germanium-on-insulator (GOI) substrate, or the like. In another embodiment, the substrate 100 may include a group III-V compound such as InP, GaP, GaAs, GaSb, etc. P-type or N-type impurities may be implanted at an upper portion of the substrate 100 to form a well (not illustrated). In some embodiments, a circuit element (not illustrated) including a gate structure, an impurity region, a contact and/or a plug may be further formed on the substrate 100.

The lower insulation layer 110 may be formed on the substrate 100, e.g., to cover the circuit element. The lower insulation layer 110 may be formed of, e.g., silicon oxide or silicon oxynitride. For example, the lower insulation layer 110 may be formed of a silicon oxide-based material such as plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), or the like. The lower insulation layer 110 may be formed by at least one process such as a chemical vapor deposition (CVD) process, a plasma enhanced chemical vapor deposition (PECVD) process, a low pressure chemical vapor deposition (LPCVD) process, a high density plasma chemical vapor deposition (HDP-CVD) process, a spin coating process, a sputtering process, an atomic layer deposition (ALD), or the like.

In example embodiments, the lower insulation layer 110 may be partially etched to form an opening such as a hole or a trench. A conductive layer including a metal such as copper (Cu), aluminum (Al), tungsten (W), etc., and filling the opening may be formed on the lower insulation layer 110 and within the opening by a deposition process or a plating process. Thereafter, an upper portion of the conductive layer may be planarized by a chemical mechanical polish (CMP) process and/or an etch-back process to form the lower wiring 115. The lower wiring 115 may be electrically connected to the circuit element formed on the substrate 100.

In some embodiments, a barrier layer (e.g., formed of a metal nitride such as titanium nitride, tantalum nitride, etc.) may be formed along a sidewall and a bottom of the opening, and on the lower insulation layer 110, before forming the conductive layer. In this case, a barrier pattern surrounding a sidewall and a bottom of the lower wiring 115 may be formed.

Figure 2:
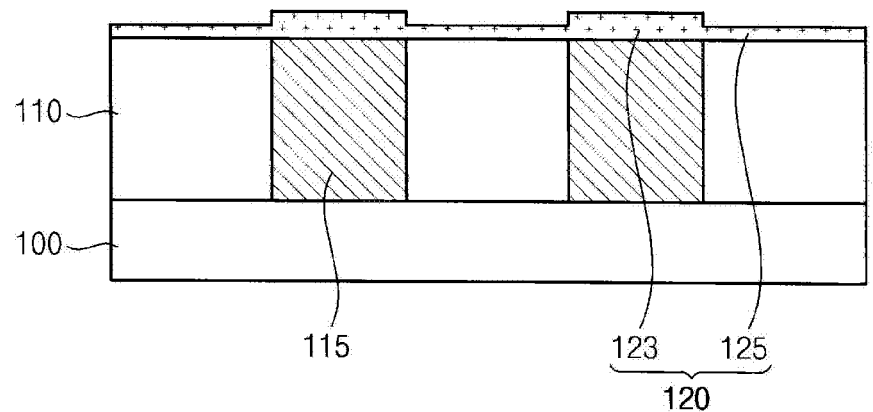

Referring to FIG. 2, a first etch-stop layer 120 may be formed on the lower insulation layer 110 and the lower wiring 115. In example embodiments, the first etch-stop layer 120 may be formed of a metallic dielectric material. In some embodiments, the metallic dielectric material may be formed of a dielectric metal nitride such as aluminum nitride.

In some embodiments, the first-etch stop layer 120 may be formed by a process such as a CVD process or an ALD process. For example, a metal precursor including a metal halogenide such as aluminum chloride ($AlCl_3$), or an organic metal compound may be provided into a process chamber together with a nitrogen-containing reactive gas such as nitrogen ($N_2$), ammonia ($NH_3$), nitrogen oxide ($NO_2$), nitrous oxide ($N_2O$), etc. Accordingly, the first etch-stop layer 120 may be provided as a dielectric metal nitride, formed through a reaction between the metal precursor and the nitrogen-containing reactive gas. In some other embodiments, the first etch-stop layer 120 may be formed by a sputtering process such as an ion-beam sputtering process or a magnetron sputtering process. For example, a metal target such as an aluminum target and the nitrogen-containing reactive gas may be used to form the first etch-stop layer 120. In some embodiments, the first etch-stop layer 120 may be formed of a metal oxynitride by adjusting types of the reactive gas used in the deposition process.

In example embodiments, the first etch-stop layer 120 may have a non-uniform thickness profile. For example, the first etch-stop layer 120 may include a first portion 123 having a relatively greater thickness, and a second portion 125 having a relatively smaller thickness. The first portion 123 and the second portion 125 may be formed on top surfaces of the lower wiring 115 and the lower insulation layer 110, respectively. A vertical cross-section of the first portion 123 may have a rectangular shape, as illustrated in FIG. 2. However, the first portion 123 may have a curved shape such as a hemisphere shape or a dome shape.

While forming the first etch-stop layer 120, metal components separated from the metal precursor or the metal target may be concentrated on the lower wiring 115 due to an affinity between metallic components of the lower wiring 115 and the metal precursor or target. Thus, the thickness of the first etch-stop layer 120 may become greater on the top surface of the lower wiring 115 to form the first portion 123. The portion of the first etch-stop layer 120 other than the first portion 123 may be defined as the second portion 125, and may substantially cover the top surface of the lower insulation layer 110.

Figure 3:
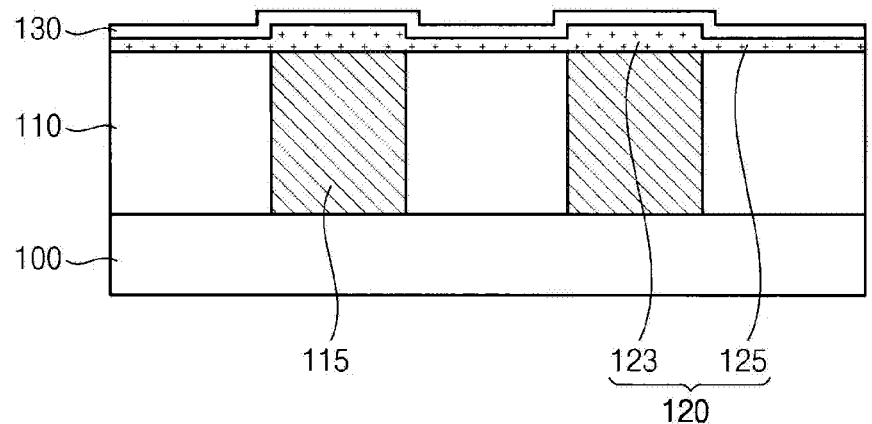

Referring to FIG. 3, a second etch-stop layer 130 may be formed on the first etch-stop layer 120. In example embodiments, the second etch-stop layer 130 may be formed of a non-metallic dielectric material. In some embodiments, the second etch-stop layer 130 may be formed of the non-metallic dielectric material in which oxygen, carbon and/or nitrogen atoms are combined with silicon atoms. For example, the second etch-stop layer 130 may be formed of at least one of silicon oxide (SiOx), silicon carbide (SiC), silicon nitride (SiN), silicon oxynitride (SiON), silicon carbonitride (SiCN), silicon oxycarbide (SiOC), or the like. In some embodiments, the second etch-stop layer 130 may be formed of silicon carbide or silicon oxycarbide for improving an etching selectivity with respect to the first etch-stop layer 120.

The second etch-stop layer 130 may be formed by a process such as a CVD process, an ALD process, etc., and may have a uniform (or at least substantially uniform) thickness. In this case, a portion of the second etch-stop layer 130 covering the first portion 123 of the first etch-stop layer 120 may have a relatively higher top surface as compared to a portion of the second etch-stop layer 130 covering the second portion 125 of the first etch-stop layer 120.

In some embodiments, the second etch-stop layer 130 may be formed by an ALD process, e.g., to provide improved deposition uniformity. For example, a silicon precursor such as a silane-based material, and a reactive gas including a carbon-containing material such as methane ($CH_4$) or ethane ($C_2H_6$) may be used in the ALD process to form the second etch-stop layer 130.

Figure 4:
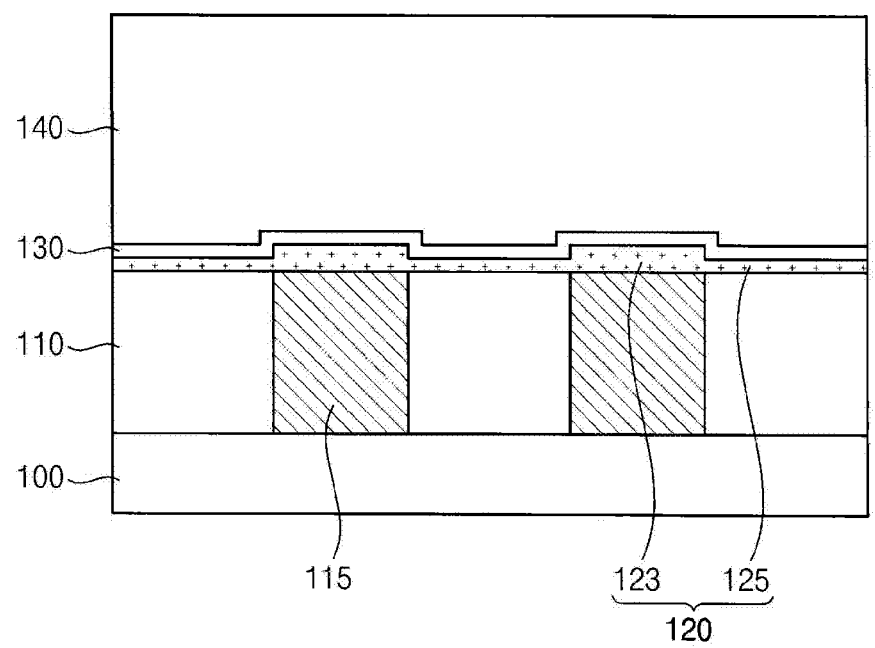

Referring to FIG. 4, an insulating interlayer 140 may be formed on the second etch-stop layer 140. The insulating interlayer 140 may be formed of a low-k silicon oxide or a siloxane-based material. For example, the insulating interlayer 130 may be formed of silicon oxide such as TEOS, BTEOS, PTEOS or BPTEOS, or polysiloxane including alkyl substituents, or the like. The insulating interlayer 140 may be formed by a CVD process.

Figure 5:
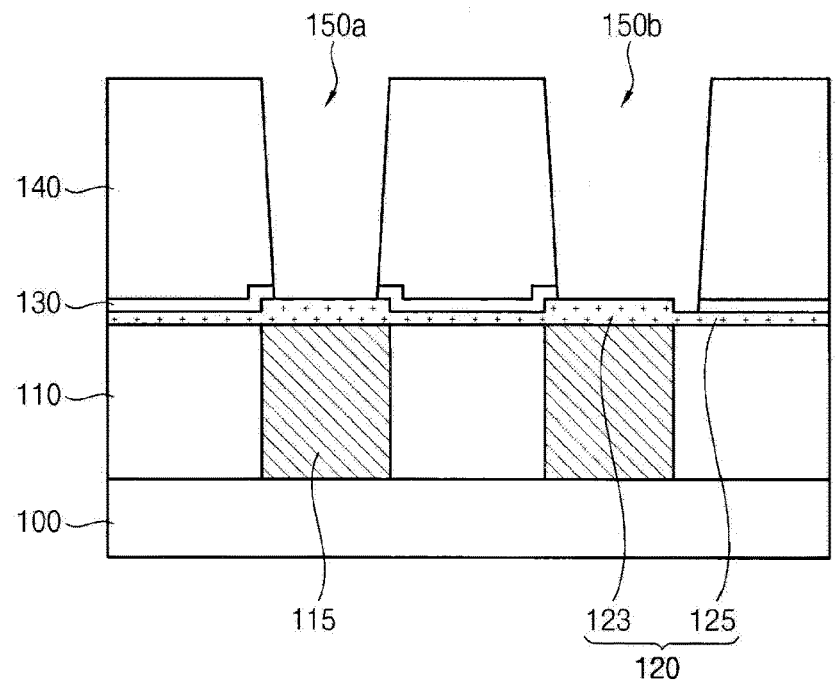

Referring to FIG. 5, the insulating interlayer 140 may be partially removed to form openings, such as a first opening 150a and a second opening 150b. The openings 150a and 150b may be formed through, e.g., the insulating interlayer 140 and the second etch-stop layer 130 such that an upper surface of the first etch-stop layer 120 is exposed through the openings 150a and 150b.

In some embodiments, the first portion 123 of the first etch-stop layer 120 may be exposed at a bottom of the first opening 150a. In this case, a top surface of the first portion 123 may define the bottom of the first opening 150a. In some embodiments, the first portion 123 of the first etch-stop layer 120 may be at least partially exposed at a bottom of the second opening 150b, and the second portion 125 may be also partially exposed through the second opening 150b.

The etching process used to form the first and second openings 150a and 150b in the insulating interlayer 140 and the second etch-stop layer 130 may include a dry etching process such as a plasma etching process, a reactive ion etching (RIE) process, etc. While performing the dry etching process, an etching rate may be preliminarily reduced by the second etch-stop layer 130; and the first etch-stop layer 120, which is formed of a different material from that of the second etch-stop layer 130, may provide an etching end-surface. Thus, the lower wiring 115 and the lower insulation layer 110 may be protected by the first etch-stop layer 120.

Figure 6:
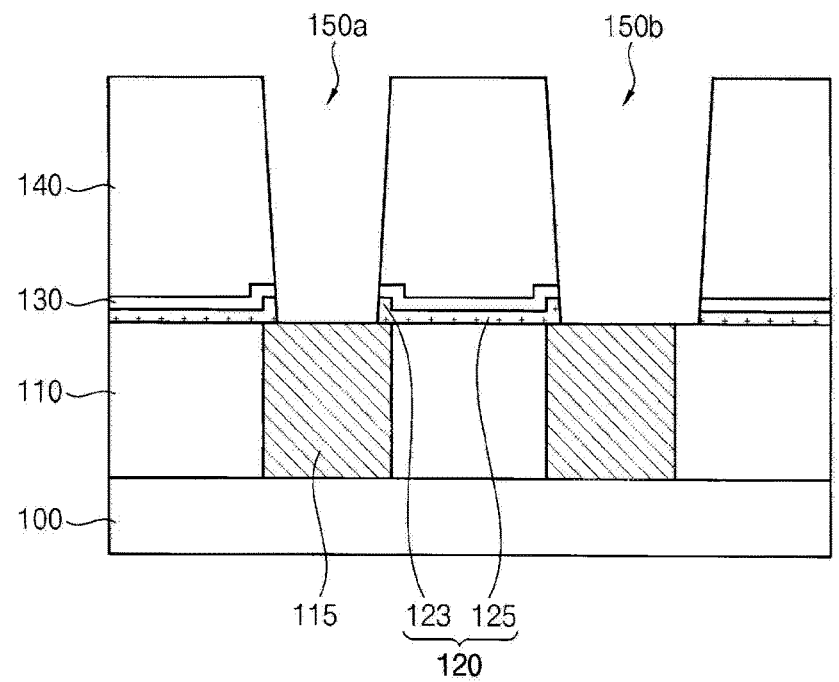

Referring to FIG. 6, portions of the first etch-stop layer 120 exposed by the openings 150a and 150b may be removed (e.g., etched) to expose a top surface of each lower wiring 115. In example embodiments, the exposed portions of the first etch-stop layer 120 may be removed by a wet etching process that is highly selective to the first etch-stop layer. For example, an acid solution including sulfuric acid, hydrochloric acid, or the like, may be used as an etching solution in the wet etching process.

Upon removing portions of the first etch-stop layer 120, first and second openings 150a and 150b may be extended (e.g., in a height direction). In some embodiments, the top surface of the lower wiring 115 may be partially exposed by a bottom of the extended first opening 150a. Accordingly, the bottom of the first opening 150a may be defined by the top surface of the lower wiring 115. In some embodiments, the top surface of the lower wiring 115 may be at least partially exposed at a bottom of the extended second opening 150b, and a top surface of the lower insulation layer 110 may be also exposed by the extended second opening 150b. Accordingly, the bottom of the second opening 150b and the top surface of the lower wiring 115 may be partially staggered with each other or partially overlap each other.

According to example embodiments as described above, the first and second etch-stop layers 120 and 130 can be considered to form a multi-layered etch-stop layer formed of different materials. Thus, a sufficient etching selectivity between the multi-layered etch-stop layer and the insulating interlayer 140 and/or between the etch-stop layer and the lower structure may be obtained. Further, the dry etching process and the wet etching process may be combined to additionally improve the etching selectivity.

Therefore, damage to the lower wiring 115 and/or the lower insulation layer 110 may be avoided while performing the etching process to form the openings 150a and 150b. Further, the first etch-stop layer 120 may be formed to be relatively thicker on the top surface on the lower wiring 115 so that the lower wiring 115 may be effectively prevented from being oxidized or physically damaged during the etching process, or from exposure to external moisture.

Additionally, compared to conventional etch-stop layers, a total thickness of the multi-layered etch-stop layer according to embodiments described herein may be reduced because sufficient etching selectivity may be achieved due to the different materials in the multi-layered, as described above. Thus, an increase of a dielectric constant caused by the multi-layered etch-stop layer may be minimized so that a parasitic capacitance or an RC delay between the lower wirings 115 and/or between conductive patterns 180 (see, e.g., FIG. 8) may be suppressed.

Figure 7:
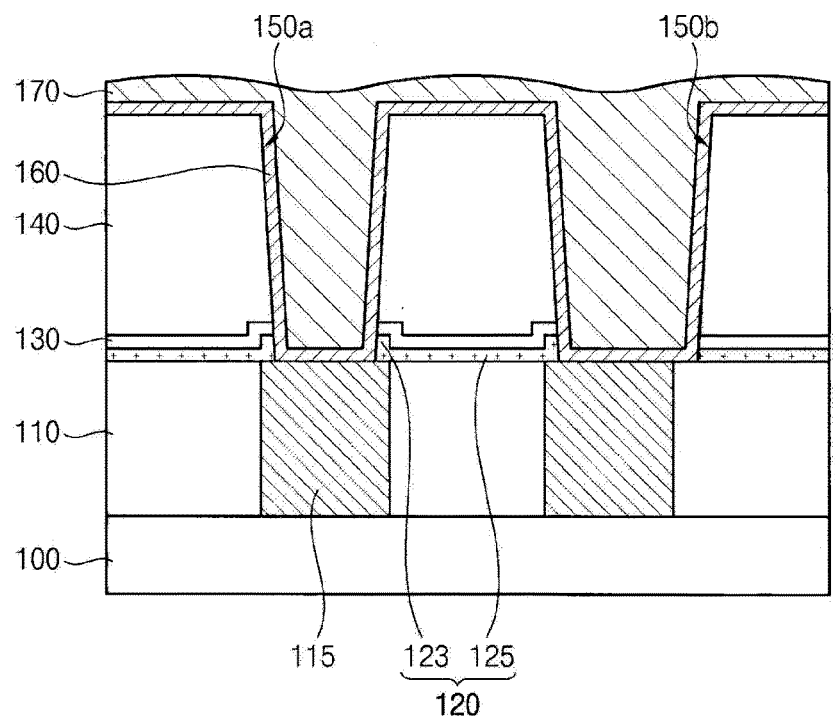

Referring to FIG. 7, an upper conductive layer filling the openings 150a and 150b may be formed. As exemplarily illustrated, the upper conductive layer may include a barrier conductive layer 160 and a metal layer 170.

In example embodiments, the barrier conductive layer 160 may be formed conformally along sidewalls and the bottoms of the openings 150a and 150b, and a top surface of the insulating interlayer 140. The barrier conductive layer 160 may be in contact with the top surfaces of the lower wiring 115 exposed through the openings 150a and 150b. An adhesion of a subsequently-formed seed layer may be improved by the presence of the barrier conductive layer 160, and diffusion of metallic material (e.g., from the seed layer or the metal layer 170) into the insulating interlayer 140 may be blocked by the barrier conductive layer 160. For example, the barrier conductive layer 160 may be formed of a material such as titanium, titanium nitride, tantalum, tantalum nitride, or the like, by a process such as a PVD process or an ALD process. In some embodiments, the barrier conductive layer 160 may be formed of a chemically stable metal such as rubidium, ruthenium or cobalt, e.g., by a CVD process.

The metal layer 170 may be formed on the barrier conductive layer 160 and fill remaining portions of the openings 150a and 150b. In some embodiments, the metal layer 170 may be formed by forming seed layer on the barrier conductive layer 160 by a PVD process using, e.g., a copper target, or a copper reflow process. Subsequently, a plating process such as a copper electroplating process may be performed. For example, the substrate 100 including the seed layer may be immersed in plating solution such as a copper sulfate solution. A current may be applied using the seed layer and the plating solution as a cathode and an anode, respectively. Accordingly, the metal layer 170 including copper may be precipitated or grown on the seed layer through an electrochemical reaction. In some other embodiments, the metal layer 170 may be deposited by a process such as a sputtering process or an ALD process.

Figure 8:
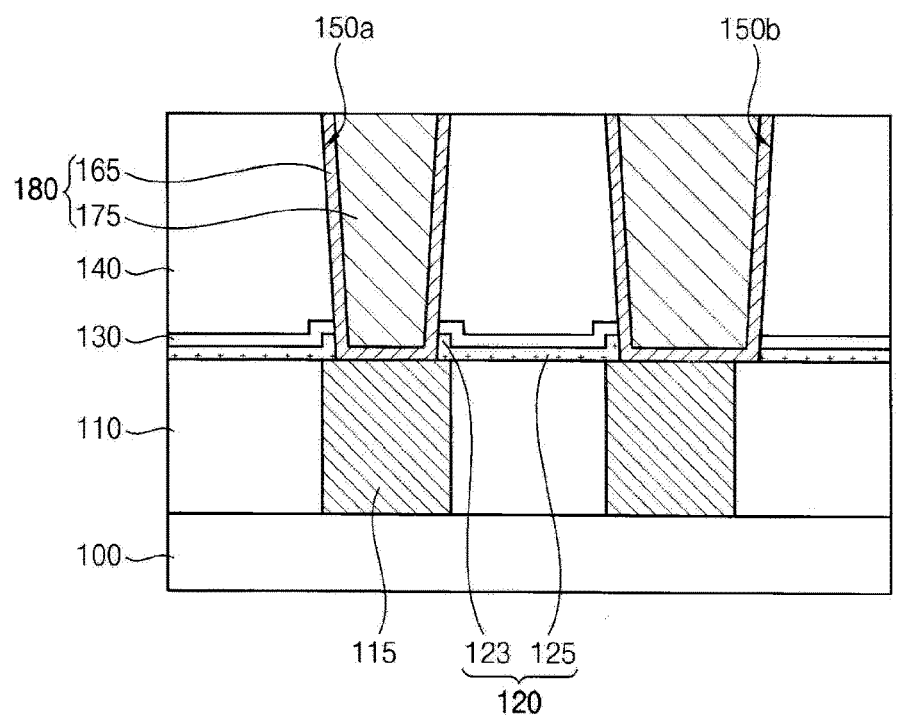

Referring to FIG. 8, upper portions of the metal layer 170 and the barrier conductive layer 160 may be planarized, e.g., by a CMP process and/or an etch-back process, until the top surface of the insulating interlayer 140 is exposed, thereby forming a conductive pattern 180 in each opening 150a and 150b, each electrically connected to a lower wiring 115. The conductive pattern 180 may thus include a barrier conductive pattern 165 and the metal pattern 175 sequentially formed on an inner wall of the openings 150a and 150b.

Each conductive pattern 180 may be in contact with the top surface of the lower wiring 115. For example, the conductive pattern 180 formed in the first opening 150a may extend through the second etch-stop layer 130 and the first portion 123 of the first etch-stop layer 120, and may be landed on the top surface of the lower wiring 115. Accordingly, the entire (or at least substantially the entire) bottom surface of the conductive pattern 180 formed in the first opening 150a may contact the top surface of the lower wiring 115. Even though the conductive pattern 180 is completely superimposed over the lower wiring 115, the lower wiring 115 may be protected from damage by the first portion 123 of the first etch-stop layer 120.

The conductive pattern 180 formed in the second opening 150b may extend through the second etch-stop layer 130, and may extend through the first and second portions 123 and 125 of the first etch-stop layer 120. Accordingly, the conductive pattern 180 formed in the second opening 150b may contact the top surfaces of the lower wiring 115 and the lower insulation layer 110. Even though the conductive pattern 180 may be substantially staggered with respect to the lower wiring 115, a sufficient etching selectivity may be provided by the first etch-stop layer 120 so that the lower insulation layer 110 may be protected from damages by the second portion 125.

In some embodiments, after forming the conductive pattern 180, the insulating interlayer 140 may be modified by, e.g., a plasma treatment or an ultraviolet irradiation to reduce a dielectric constant or a permittivity of the insulating interlayer 140. In some embodiments, a capping layer covering a top surface of the conductive pattern 180 may be formed using a chemically stable metal such as cobalt, molybdenum, aluminum, or the like.

In some embodiments, a build-up process for an additional wiring may be further performed on the insulating interlayer 140 and the conductive patterns 180. In this case, a multi-layered etch-stop layer, substantially the same as or similar to that described above with reference to FIGS. 2 and 3, may be formed on the insulating interlayer 140 and the conductive patterns 180 and then the build-up process may be performed.

Figure 9:
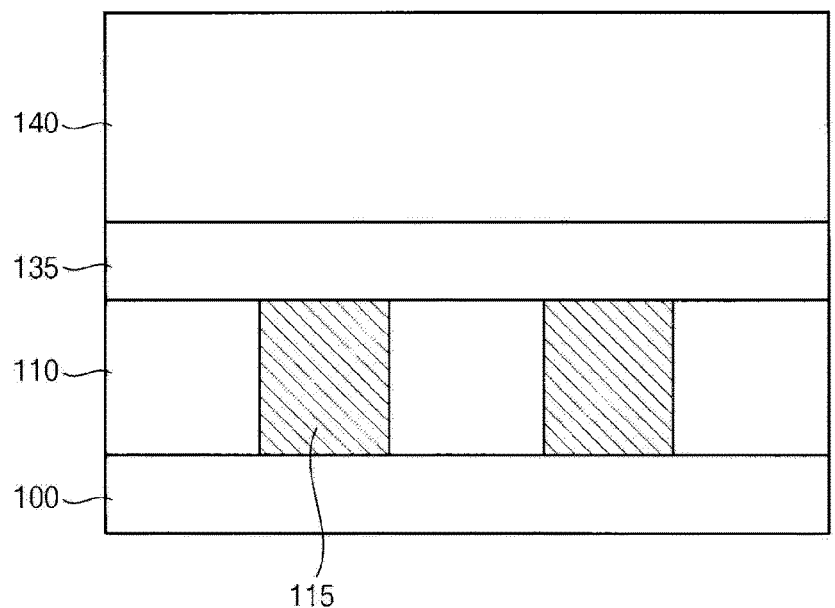
FIGS. 9 and 10 are cross-sectional views illustrating a method of forming a wiring structure in accordance with a comparative example.
Figure 10:
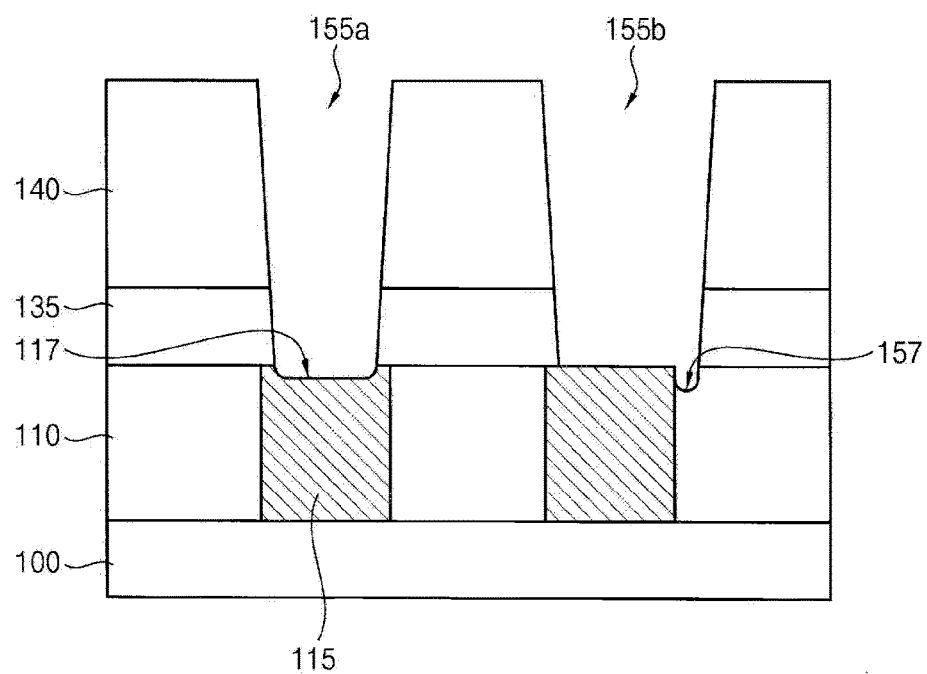

FIGS. 9 and 10 are cross-sectional views illustrating a method of forming a wiring structure in accordance with a comparative example.

Referring to FIG. 9, the lower structure including the lower insulation layer 110 and the lower wiring 115 may be formed on the substrate 100, e.g., as discussed above with respect to FIG. 1. Thereafter, an etch-stop layer 135 may be formed on the lower insulation layer 110 and the lower wiring 115, and the insulating interlayer 140 may be formed (e.g., in a manner substantially the same as or similar to that discussed above with reference to FIG. 4) on the etch-stop layer 135.

The etch-stop layer 135 may be formed as a single-layered structure, and be formed of a material such as silicon nitride or silicon oxynitride. Thus, a thickness of the etch-stop layer 135 may need to be greater than the thickness of the second etch-stop layer 120 described above with respect to in FIG. 3 to provide a sufficient protection to the underlying structures during a subsequent etching process.

Referring to FIG. 10, the insulating interlayer 140 and the etch-stop layer 135 may be sequentially and partially etched to form first and second openings 155a and 155b, respectively, through each of which a lower wiring 115 may be exposed. For example, a top surface of the lower wiring 115 may be exposed by a first opening 155a, and top surfaces of the lower wiring 115 and the lower insulation layer 110 may be commonly exposed by a second opening 155b.

According to the comparative example, as the thickness of the etch-stop layer 135 increases, the amount of material to be etched to form the openings 155a and 155b may also increase. Additionally, sufficient etching selectivity may not be obtained from the single-layered etch-stop layer 135. Thus, the top surface of the lower wiring 115 exposed by the first opening 155a may also be physically eroded or chemically damaged or transformed (e.g., as shown at surface 117). An upper portion of the lower insulation layer 110 exposed by the second opening 155b may also be damaged (e.g., to form a recess 157 therein) and a lateral portion of the lower wiring 115 may be further damaged through the recess 157. Further, as the thickness of the etch-stop layer 135 increases, a dielectric constant or a permittivity between the lower wirings 115 may increase to cause a parasitic capacitance and an RC delay.

However, according to example embodiments as described with reference to FIGS. 1 to 8, the multi-layered etch-stop layer may include different materials to improve etching selectivity while suppressing an increase of the dielectric constant or the permittivity. Further, a thickness of the multi-layered etch-stop layer may be selectively increased on the top surface of the lower wiring 115 so that the lower wiring 115 may be beneficially protected from etching damage and external moisture.

FIGS. 11 to 17 are cross-sectional views illustrating a method of forming a wiring structure in accordance with some example embodiments. In FIGS. 11 to 17, detailed descriptions regarding processes and/or materials substantially the same as or similar to those described above with reference to FIGS. 1 to 8 are omitted herein, and like reference numerals are used to designate like elements.

Figure 11:
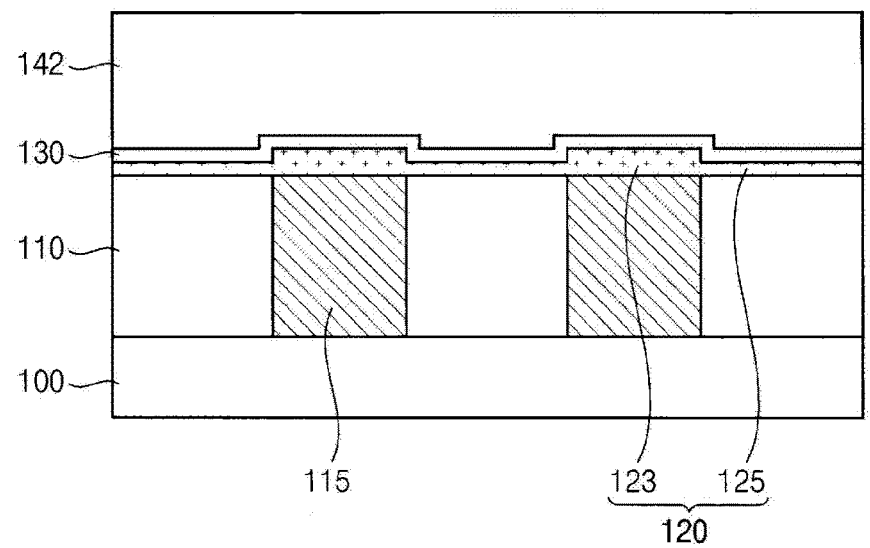
FIGS. 11 to 17 are cross-sectional views illustrating a method of forming a wiring structure in accordance with some example embodiments.

Referring to FIG. 11, processes substantially the same as or similar to those described with reference to FIGS. 1 to 4 may be performed. In example embodiments, a multi-layered etch-stop layer, e.g., including a first etch-stop layer 120 and a second etch-stop layer 130, may be formed on a lower structure including a lower insulation layer 110 and a lower wiring 115 formed on a substrate 100. A first insulating interlayer 142 may be formed on the etch-stop layer.

As described above, the first etch-stop layer 120 may be formed of a metallic dielectric material such as aluminum nitride. The first etch-stop layer 120 may include a first portion 123 formed on the lower wiring 115 and having a relatively large thickness, and a second portion 125 formed on the lower insulation layer 110 and having a relatively small thickness. The second etch-stop layer 130 may be formed of a non-metallic dielectric material such as silicon carbide or silicon oxycarbide, and may be formed conformally along a profile of the first etch-stop layer 120. The first insulating interlayer 142 may be formed of a material such as a silicon-oxide based material.

Figure 12:
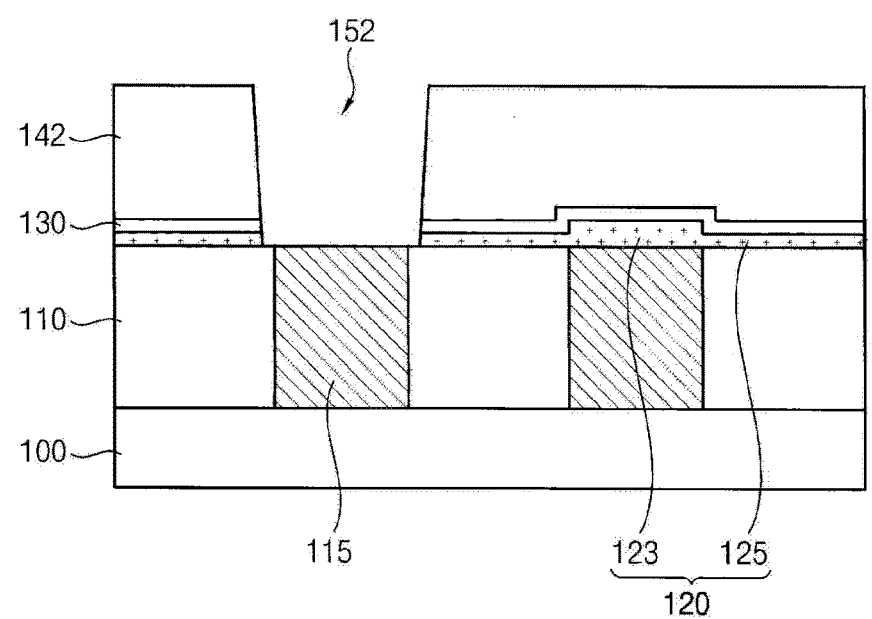

Referring to FIG. 12, processes substantially the same as or similar to those described above with reference to FIGS. 5 and 6 may be performed to form a first opening 152. In example embodiments, the first insulating interlayer 142 and the second etch-stop layer 130 may be partially etched by a dry etching process to form a preliminary first opening. A portion of the first etch-stop layer 120 exposed by the preliminary first opening may thereafter be removed by a wet etching process to form the first opening 152, through which the lower wiring 115 is exposed.

In some embodiments, a top surface of the lower wiring 115 may be completely exposed through the first opening 152. A top surface of the lower insulation layer 110 around the lower wiring 115 may be also exposed through the first opening 152. As illustrated in FIG. 12, even when the first opening 152 has a wide area or a large width, the lower wiring 115 and the lower insulation layer 110 may be protected from an etching damage by the multi-layered etch-stop layer.

Figure 13:
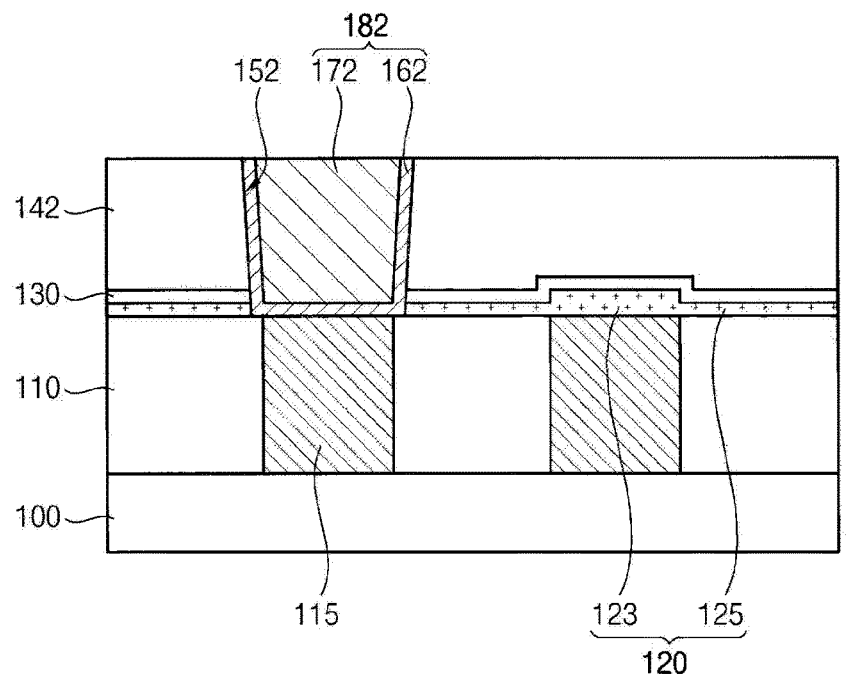

Referring to FIG. 13, processes substantially the same as or similar to those described above with reference to FIGS. 7 and 8 may be performed to form a first conductive pattern 182 in the first opening 152. The first conductive pattern 182 may include a first barrier conductive pattern 162 formed on a sidewall and a bottom of the first opening 152, and a first metal pattern 172 filling the first opening 152 on the first barrier conductive pattern 162. The first conductive pattern 182 may be in contact with the entire top surface of the lower wiring 115, and the top surface of the lower insulation layer 110 according to a shape of the first opening 152.

Figure 14:
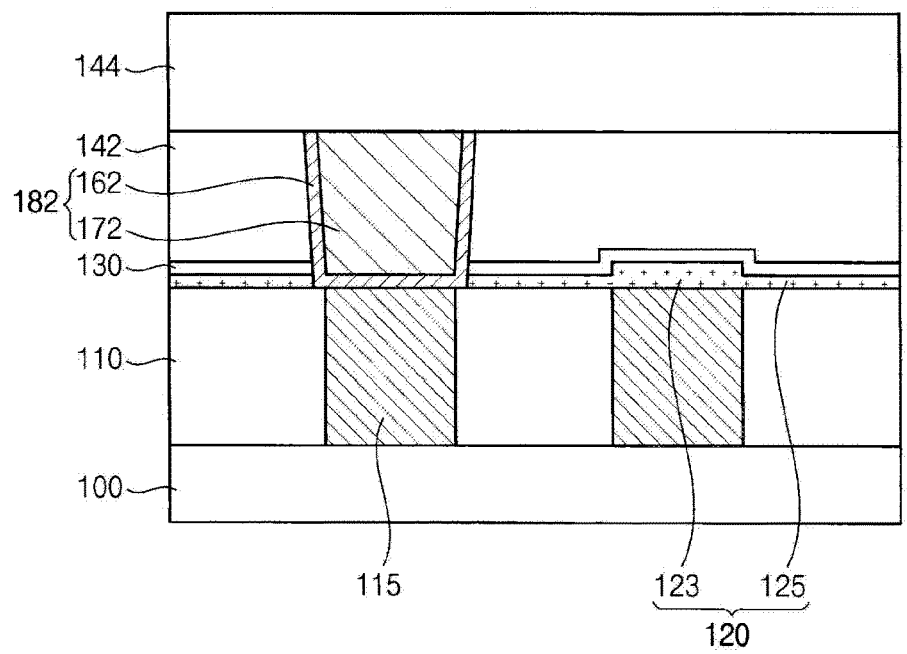

Referring to FIG. 14, a second insulating interlayer 144 may be formed on the first insulating interlayer 142 and the first conductive pattern 182. The second insulating interlayer 144 may be formed of a silicon oxide-based material, which may be substantially the same as or similar to that of the first insulating interlayer 142.

Figure 15:
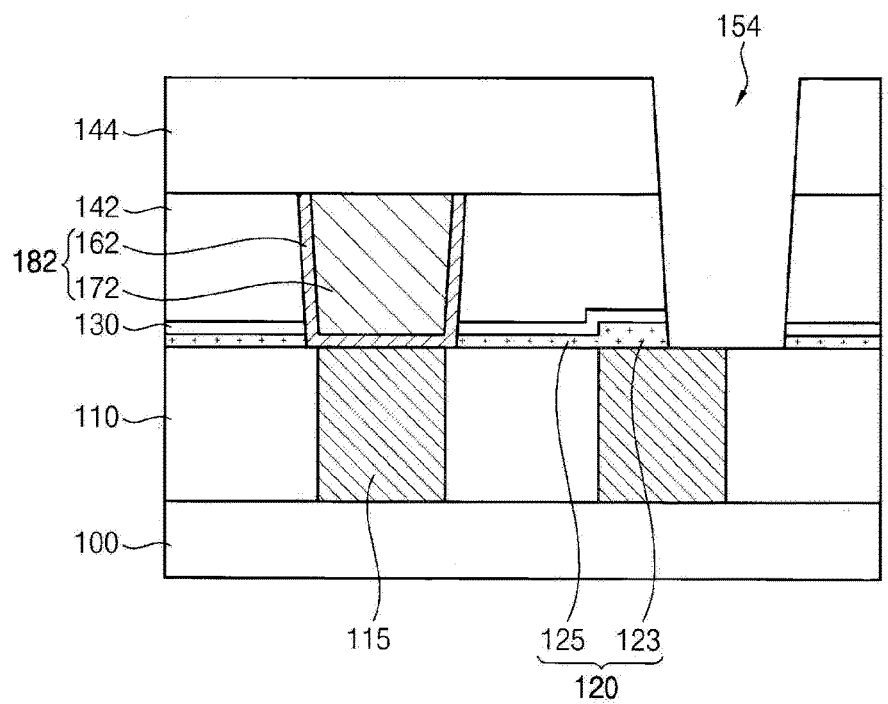

Referring to FIG. 15, a via hole 154 extending through the second insulating interlayer 144, the first insulating interlayer 142, the second etch-stop layer 130 and the first etch-stop layer 120 may be formed. In some embodiments, the second insulating interlayer 144, the first insulating interlayer 142 and the second etch-stop layer 130 may be partially removed by a dry etching process to form a preliminary via hole through which the first etch-stop layer 120 may be exposed. A portion of the first etch-stop layer 120 exposed through preliminary via hole may be removed by a wet etching process to form the via hole 154. The via hole 154 may extend commonly through the first portion 123 and the second portion 125 of the first etch-stop layer 120, and top surfaces of the lower wiring 115 and the lower insulation layer 110 may be exposed therethrough.

Figure 16:
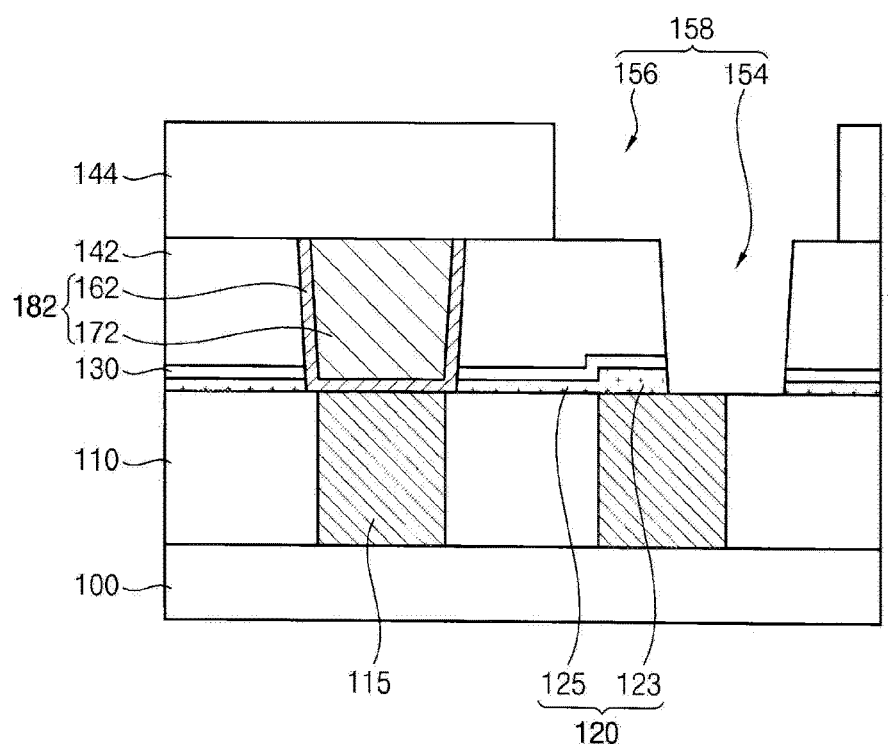

Referring to FIG. 16, the second insulating interlayer 144 may be partially etched to form a trench 156 in communication with an upper portion of the via hole 154. Accordingly, a second opening 158 formed from a dual damascene process and may include the via hole 154 and the trench 156 which may be integral with each other may be formed. The trench 156 may be formed at the upper portion of the via hole 154, and may extend linearly (e.g., in one direction). In some embodiments, the via hole 154 may be sufficiently spaced apart from the first conductive pattern 182 so that the trench 156 and the first conductive pattern 182 do not overlap each other. Thus, a relatively large area of the top surface of the lower insulation layer 110 may be exposed by the via hole 154. However, the multi-layered etch-stop layer may be utilized to prevent an etching damage of the lower insulation layer 110.

Figure 17:
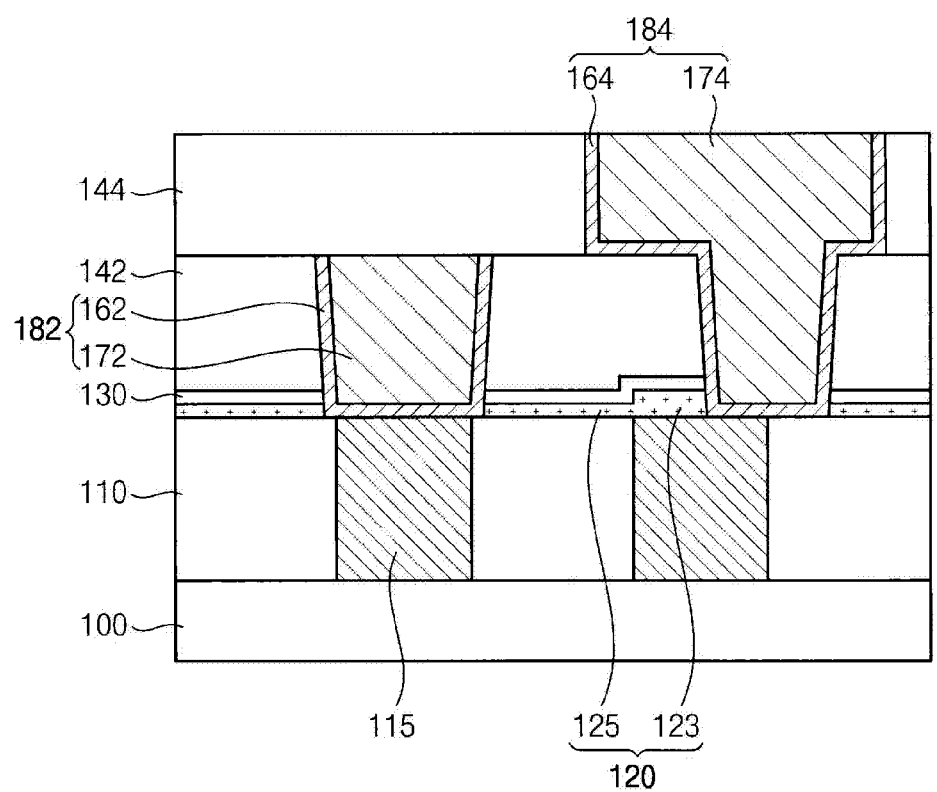

Referring to FIG. 17, a second conductive pattern 184 electrically connected to the lower wiring 115 may be formed in the second opening 158. The second conductive pattern 184 may be formed from processes substantially the same as or similar to those described above with reference to FIGS. 7 and 8. The second conductive pattern 184 may include a second barrier conductive pattern 164 conformally formed along sidewalls and bottoms of the trench 156 and the via hole 154, and a second metal pattern 174 filling the second opening 158 on the second barrier conductive pattern 164.

According to example embodiments described above, in the wiring structure including a combination of a dual damascene wiring and a single damascene wiring, the multi-layered etch-stop layer may be utilized so that damage to the lower insulation layer 110 and the lower wiring 115 may be prevented while maintaining a sufficient distance between the dual damascene wiring and the single damascene wiring. Accordingly, a parasitic capacitance and a crosstalk between the wirings may be reduced. Further, even though a density of the wirings increases, a thickness of the etch-stop layer may be reduced to prevent an increase of the parasitic capacitance.

FIGS. 18 to 23 are cross-sectional views illustrating a method of forming a wiring structure in accordance with some example embodiments. Detailed descriptions regarding processes and/or materials substantially the same as or similar to those described above with reference to FIGS. 1 to 8 may be omitted herein, and like reference numerals are used to designate like elements.

Figure 18:
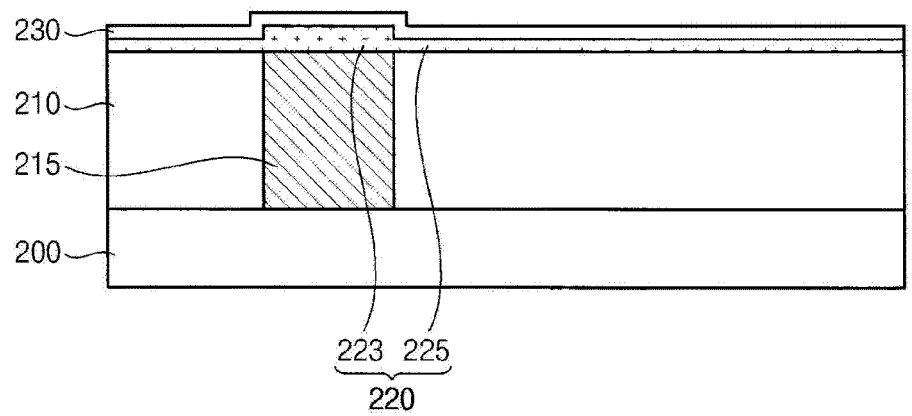
FIGS. 18 to 23 are cross-sectional views illustrating a method of forming a wiring structure in accordance with some example embodiments.
Figure 19:
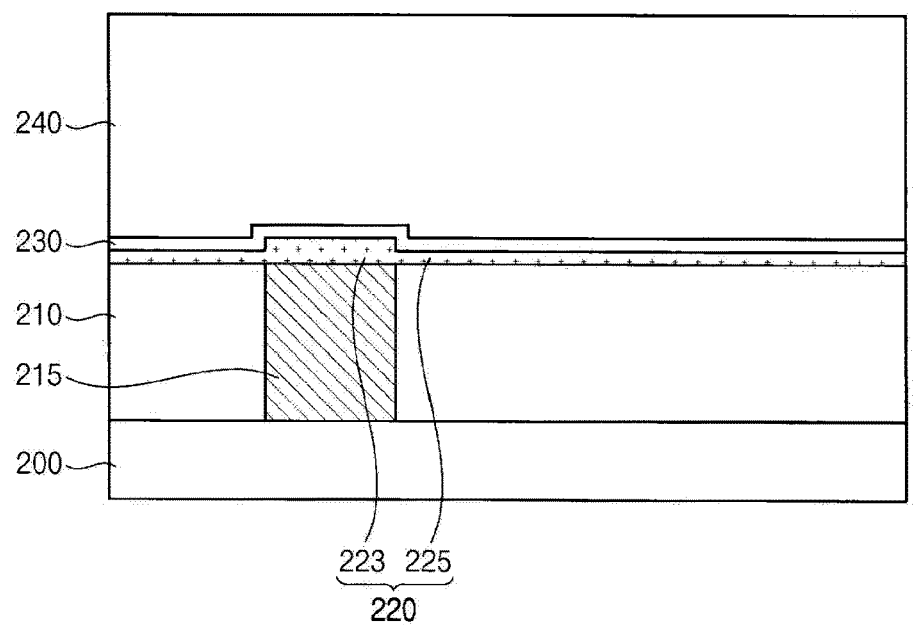

Referring to FIG. 18, processes substantially the same as or similar to those described above with reference to FIGS. 1 to 3 may be performed. In example embodiments, a multi-layered etch-stop layer including a first etch-stop layer 220 and a second etch-stop layer 230 may be formed on a lower structure including a lower insulation layer 210 and a lower wiring 215 which may be formed on a substrate 200. As described above, the first etch-stop layer 220 may be formed of a metallic dielectric material such as aluminum nitride. The first etch-stop layer 220 may include a first portion 223 formed on the lower wiring 215 and having a relatively large thickness, and a second portion 225 formed on the lower insulation layer 210 and having a relatively small thickness. The second etch-stop layer 230 may be formed of a non-metallic dielectric material such as silicon carbide or silicon oxycarbide, and may be formed conformally (or at least substantially conformally) along a profile of the first etch-stop layer 220. Referring to FIG. 19, a process substantially the same as or similar to that described above with reference to FIG. 4 may be performed to form an insulating interlayer 240 on the second etch-stop layer 230.

Figure 20:
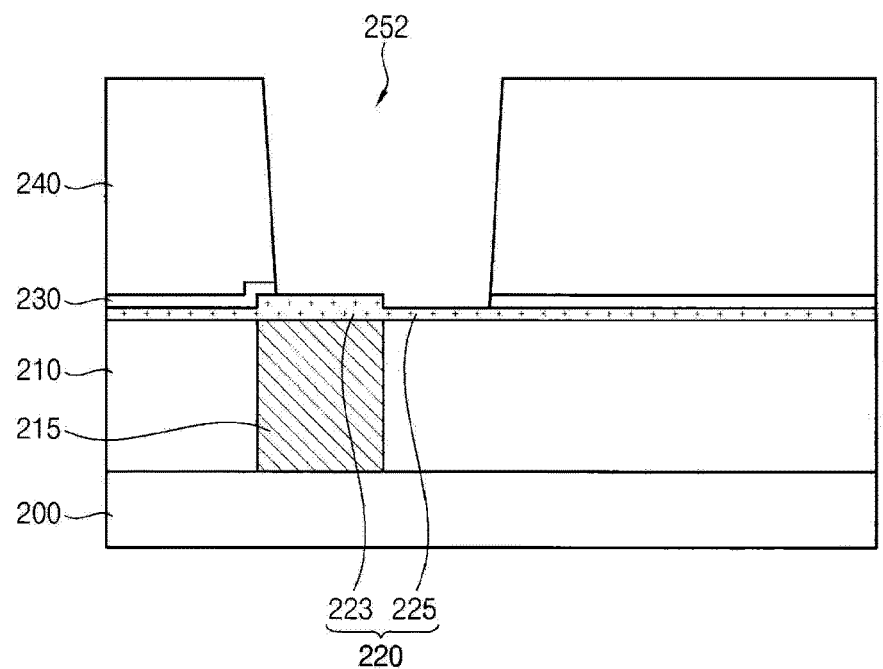

Referring to FIG. 20, a process substantially the same as or similar to that illustrated with reference to FIG. 5 may be performed to form a preliminary via hole 252. The preliminary via hole 252 may be formed by sequentially and partially etching the insulating interlayer 240 and the second etch-stop layer 230 through, e.g., a dry etching process. An upper surface of the first etch-stop layer 220 may be exposed through the preliminary via hole 252. In some embodiments, the first and second portions 223 and 225 of the first etch-stop layer 220 may be exposed through the preliminary via hole 252.

Figure 21:
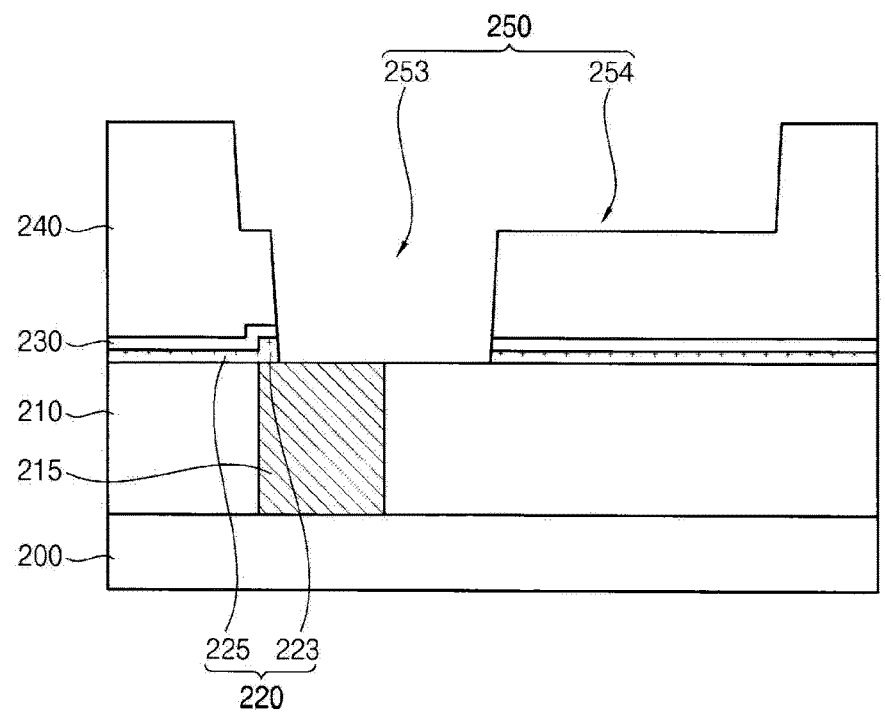

Referring to FIG. 21, an upper portion of the insulating interlayer 240 may be partially removed (e.g., by an etching process) to form a trench 254 connected to the preliminary via hole 252. In one embodiment, the preliminary via hole 252 may be extended during formation of the trench 254 to form a via hole 253 exposing the lower wiring 215. In another embodiment, after the formation of the preliminary via hole 252, the first etch-stop layer 220 may be removed by a wet etching process to form the via hole 253 before partially removing the upper portion of the insulating interlayer 240 to form the trench 254. Accordingly, an opening 250, which includes the via hole 253 and the trench 254, may be formed in the insulating interlayer 240, which may be single-layered or single-leveled, by a dual damascene process. The trench 254 may be integral with an upper portion of the via hole 253, and may extend in a lateral direction.

As exemplarily illustrated, a top surface of the lower insulation layer 210 and a top surface of the lower wiring 215 may be exposed through the via hole 253, in consideration of a process margin. In this case, the lower wiring 215 may be protected by the relatively-thick first portion 225 of the first etch-stop layer 220, and the lower insulation layer 210 may be protected by the second portion 223 of the first etch-stop layer 220.

Figure 22:
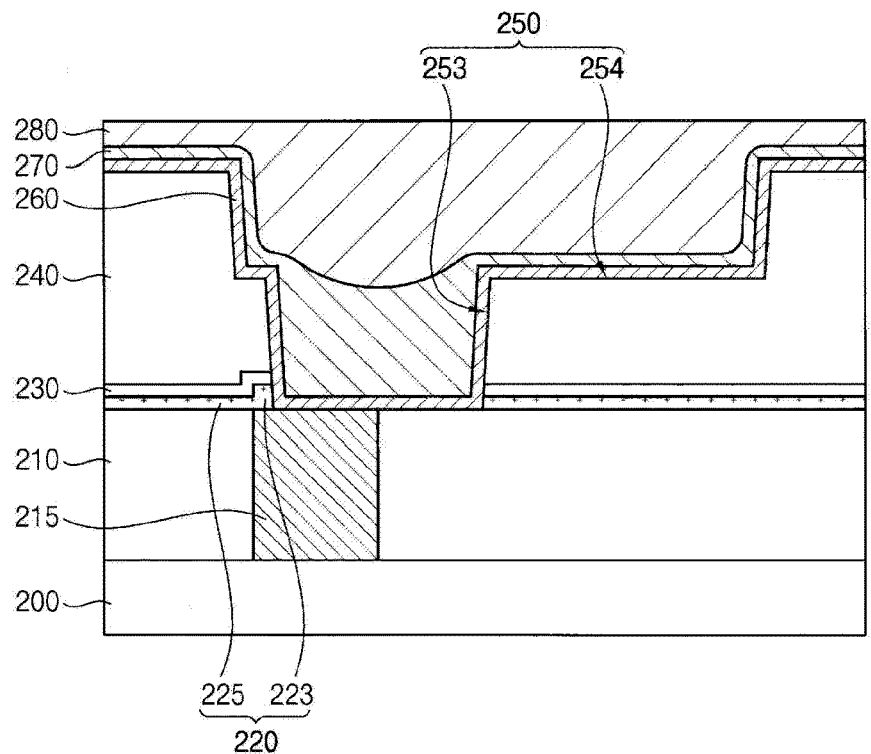

Referring to FIG. 22, a barrier conductive layer 260, a seed layer 270 and a metal layer 280 may be sequentially formed on the insulating interlayer 240 to fill the opening 250. The barrier conductive layer 260 may be formed of a metal nitride such as titanium nitride, tantalum nitride, or the like, or a chemically stable metal such as ruthenium, molybdenum, cobalt, or the like. The seed layer 270 may be formed by a copper reflow process or a copper sputtering process. The metal layer 280 may be precipitated or grown from the seed layer 270 by, e.g., a copper plating process. In some embodiments, the seed layer 270 may sufficiently fill the via hole 253, and may extend on a sidewall and a bottom of the trench 254. Accordingly, a sufficient amount of the metal layer 280 may be formed within a short period in the trench 254.

Figure 23:
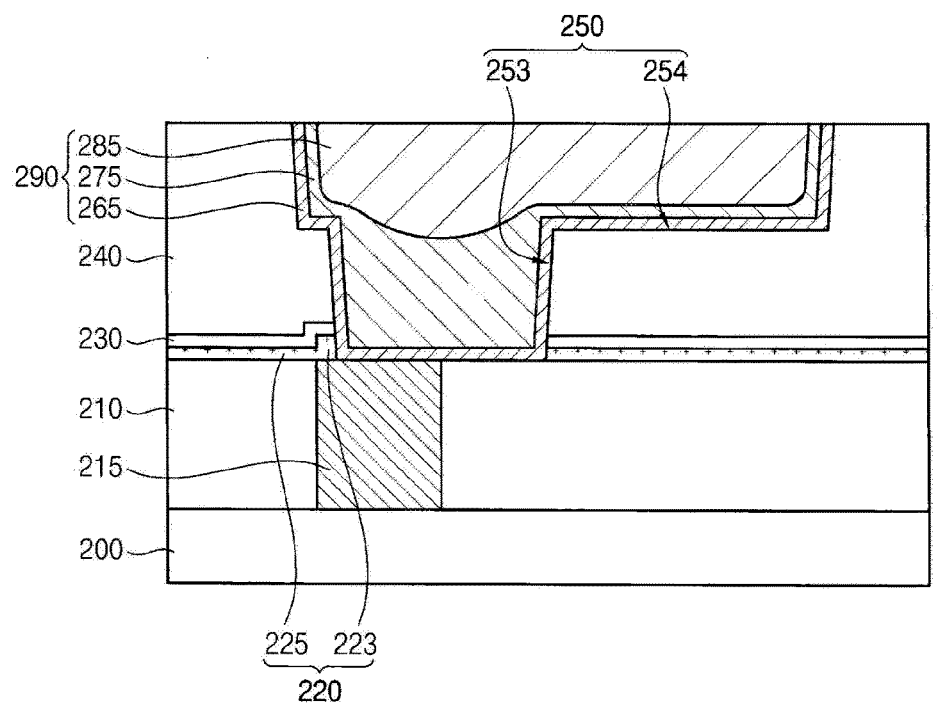

Referring to FIG. 23, upper portions of the metal layer 280, the seed layer 270 and the barrier conductive layer 260 may be planarized to form a conductive pattern 290 in the opening 250. The conductive pattern 290 may include a barrier conductive pattern 265, a seed pattern 275 and a metal pattern 285 sequentially formed on an inner wall of the opening 250.

A portion of the conductive pattern 290 formed in the via hole 253 may be defined as a via portion, and may be in contact with or electrically connected to the lower wiring 215. A portion of the conductive pattern 290 formed in the trench 254 may be integral with the via portion and may be defined as a wiring portion, and may extend in a lateral direction. The via portion may be staggered with the lower wiring 215, and may contact the lower wiring 215 and the lower insulation layer 210. The lower insulation layer 210 may be protected by the multi-layered etch-stop layer so that the via portion does not penetrate into the lower insulation layer 210 and is formed at a desired level.

FIGS. 24 to 29 are cross-sectional views illustrating a method of forming a wiring structure in accordance with some example embodiments. Detailed descriptions regarding processes and/or elements substantially the same as or similar to those described above with reference to FIGS. 1 to 8 are omitted herein, and like reference numerals are used to designate like elements.

Figure 24:
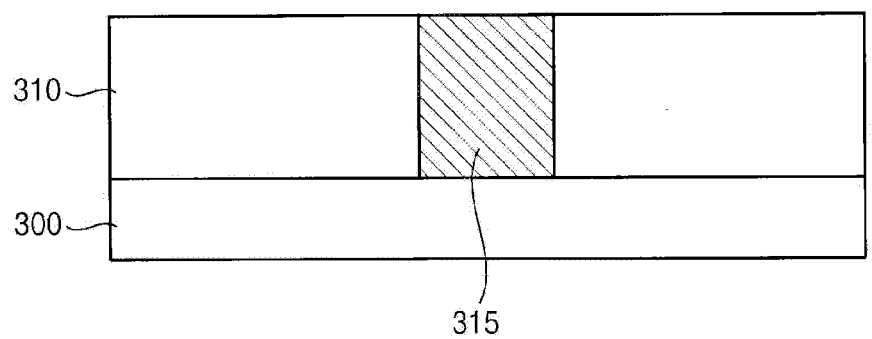
FIGS. 24 to 29 are cross-sectional views illustrating a method of forming a wiring structure in accordance with some example embodiments.

Referring to FIG. 24 a lower structure including a lower insulation layer 310 and a lower wiring 315 may be formed on a substrate 300, e.g., as discussed above with respect to FIG. 1.

Figure 25:
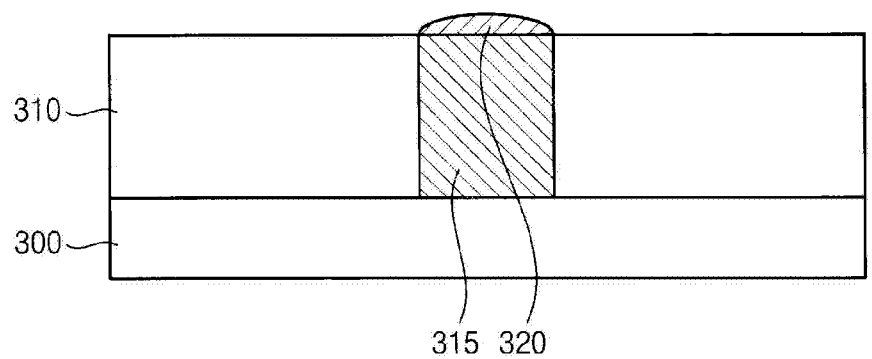

Referring to FIG. 25, a first etch-stop layer 320 covering a top surface of the lower wiring 315 may be formed. In example embodiments, the first etch-stop layer 320 may be selectively formed on the top surface of the lower wiring 315. In this case, the first etch-stop layer 320 may not be formed on a top surface of the lower insulation layer 310, or may only partially cover the top surface of the lower insulation layer 310 around the lower wiring 315.

In example embodiments, the first etch-stop layer 320 may be formed of a metallic dielectric material such as a dielectric metal nitride, e.g., as discussed above with respect to FIG. 2. For example, if a metal precursor is introduced into a process chamber, the metal precursor may be selectively self-assembled on the lower wiring 315 due to an affinity between metal components of the lower wiring 315 and the metal precursor. After a predetermined time interval, a nitrogen-containing reactive gas may be introduced into the process chamber to form the first etch-stop layer 320 selectively covering the lower wiring 315. As illustrated in FIG. 25, the first etch-stop layer 320 may be formed to have a hemispherical or dome shape.

Figure 26:
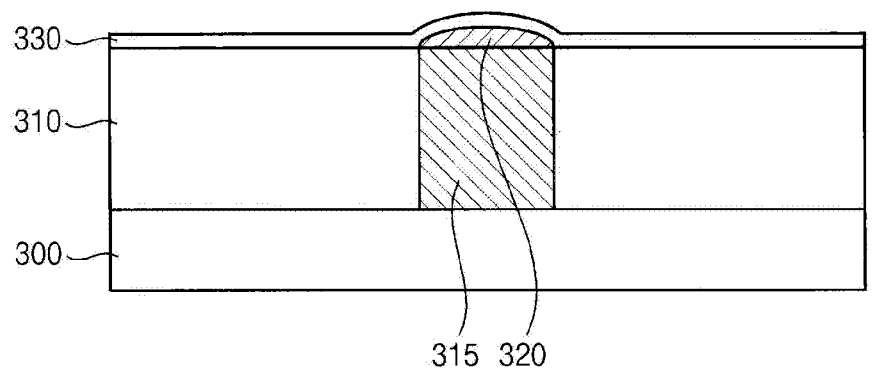

Referring to FIG. 26, a process substantially the same as or similar to that described above with reference to FIG. 3 may be performed to form a second etch-stop layer 330 on the first etch-stop layer 320 and the lower insulation layer 310. The second etch-stop layer 330 may cover the first etch-stop layer 320, and may be in contact with a top surface of the lower insulation layer 310.

Figure 27:
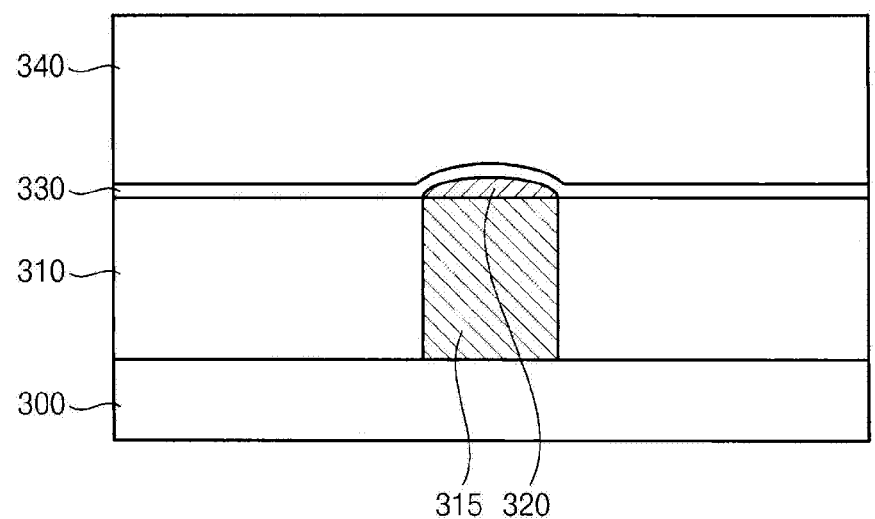

Referring to FIG. 27, a process substantially the same as or similar to that described above with reference to FIG. 4 may be performed to form an insulating interlayer 340 on the second etch-stop layer 330.

Figure 28:
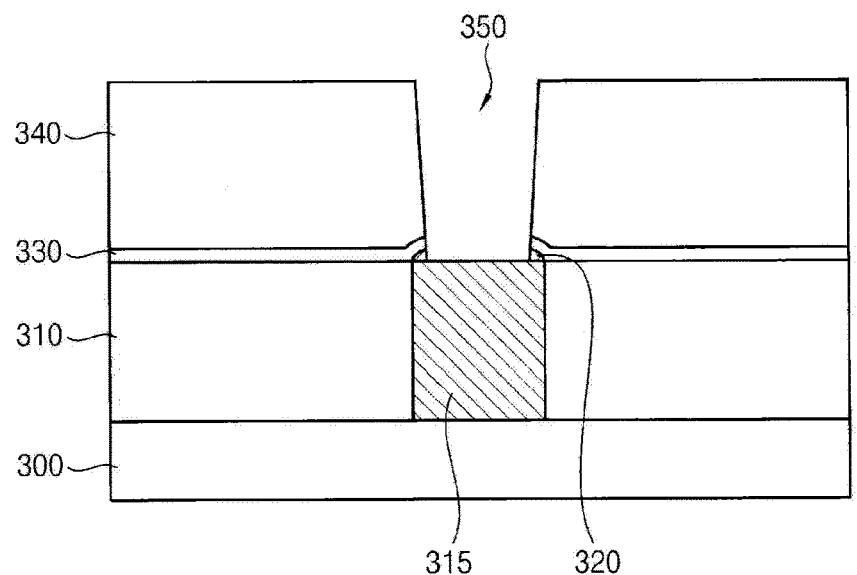

Referring to FIG. 28, processes substantially the same as or similar to those described above with reference to FIGS. 5 and 6 may be performed to form an opening 350. In example embodiments, the insulating interlayer 340 and the second etch-stop layer 330 may be partially removed by a dry etching process to form a preliminary opening. A portion of the first etch-stop layer 320 exposed through the preliminary opening may be removed by a wet etching process to form an opening 350 exposing a top surface of the lower wiring 315. In some embodiments, the opening 350 may partially expose the top surface of the lower wiring 315, and may not expose the top surface of the lower insulation layer 320. Accordingly, the top surface of the lower wiring 315 may define the bottom of the opening 350. The multi-layered etch-stop layer may be formed on the lower wiring 315 so that damage to the lower wiring 315 from the etching process and/or exposure to external moisture during formation of the opening 350 may be avoided.

Figure 29:
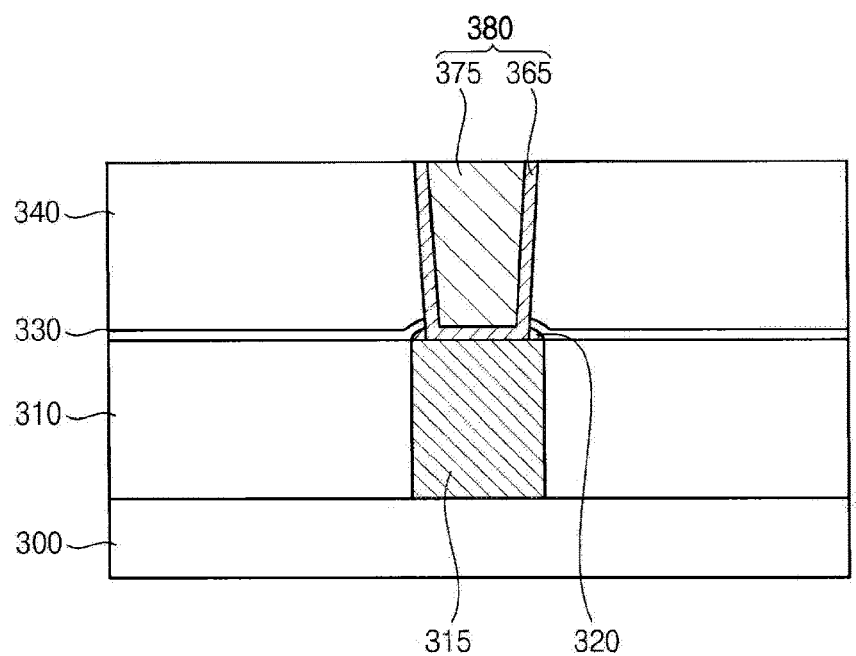

Referring to FIG. 29, processes substantially the same as or similar to those described above with reference to FIGS. 7 and 8 may be performed to form a conductive pattern 380 electrically connected to the lower wiring 315. The conductive pattern 380 may include a barrier conductive pattern 365 formed on an inner wall of the opening 350, and a metal pattern 375 filling the opening 350 on the barrier conductive pattern 365. The conductive pattern 350 may extend through the insulating interlayer 340, the second etch-stop layer 330 and the first etch-stop layer 320, and may be landed on the top surface of the lower wiring 315. The first etch-stop layer 320 may remain on the top surface of the lower wiring 315, and may have a ring shape surrounding a lower portion of the conductive pattern 380.

According to example embodiments as described above, in the wiring structure which may be stacked in a vertical and linear direction, the first etch-stop layer of the multi-layered etch-stop layer may be selectively formed on a top surface of a wiring at each level to prevent an etching damage of the wiring at each level.

Figure 30:
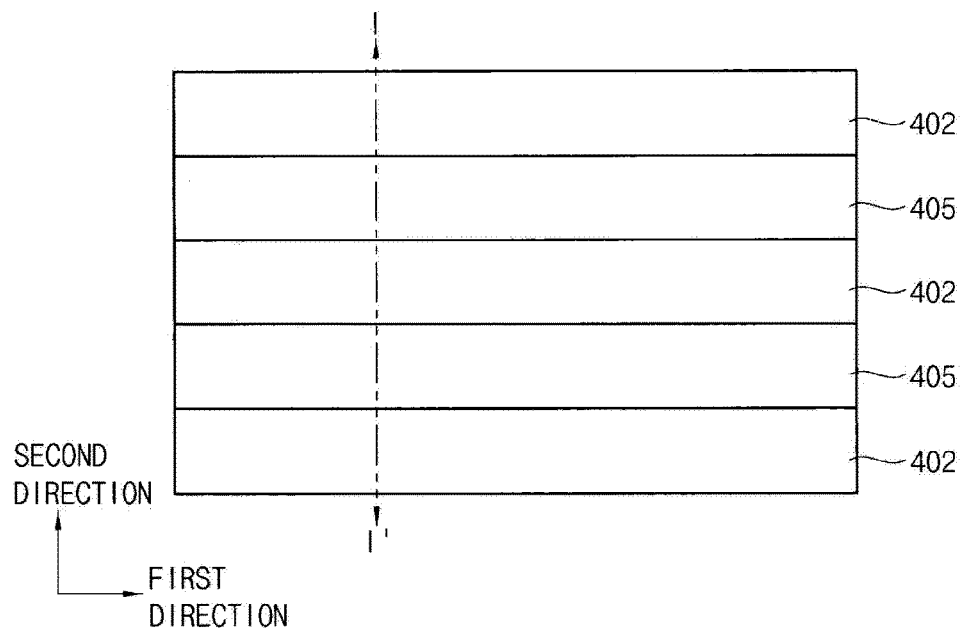
Figure 31:
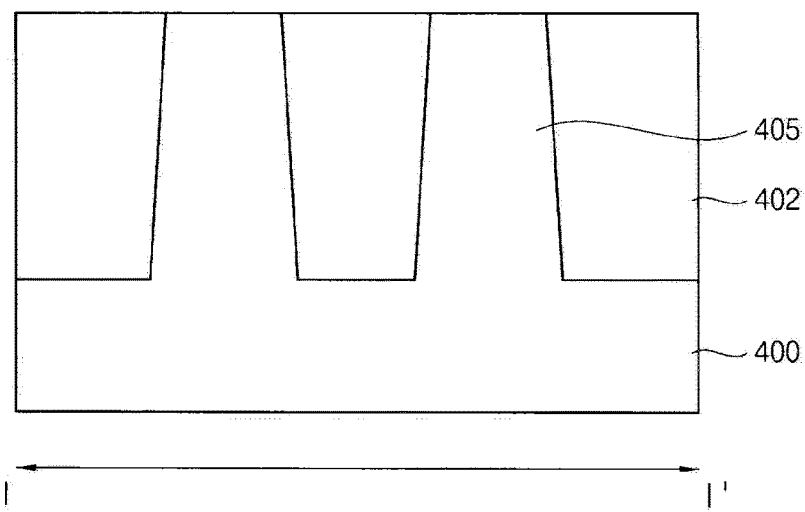
Figure 32:
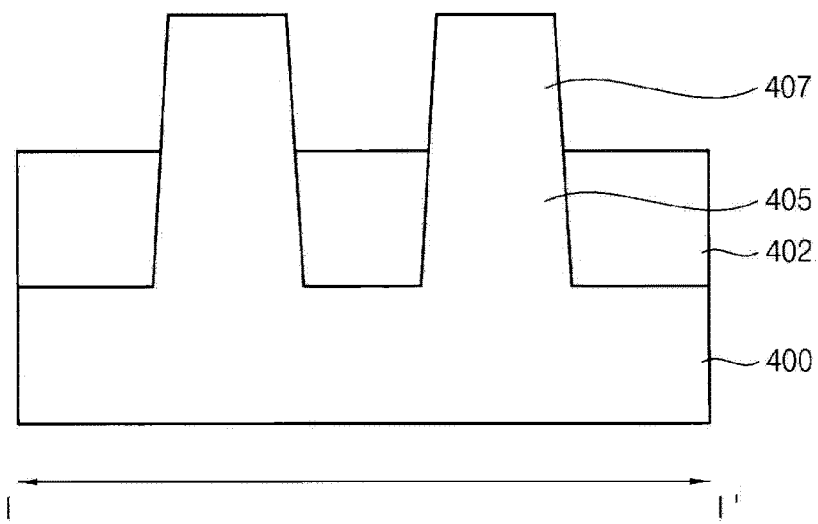
Figure 33:
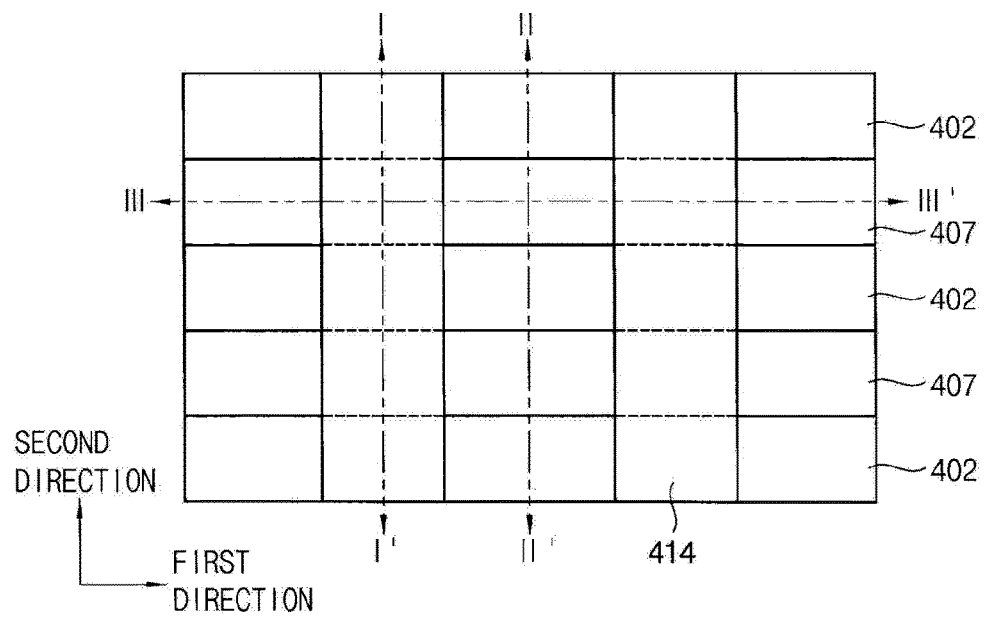

FIGS. 30 to 54 are cross-sectional views illustrating a method of manufacturing a semiconductor device (e.g., a fin field-effect transistor (FinFET)) in accordance with some example embodiments. Specifically, FIGS. 30, 33 and 36 are top plan views illustrating the method. FIGS. 31 and 32 are cross-sectional views taken along line I-I' shown in FIG. 30. FIGS. 34, 38, 40, 42, 44, 46, 48 and 50 include sub-cross sectional views taken along lines I-I' and II-II' shown in FIGS. 33 and 36. FIGS. 35, 37, 39, 41, 43, 45, 47, 49, and 51 to 54 are cross-sectional views taken along line shown in FIGS. 33 and 36. In FIGS. 30 to 54, two directions substantially parallel to a top surface of a substrate and substantially perpendicular to each other are referred to as a first direction and a second direction. For purposes of discussion, the direction indicated by an arrow and a reverse direction thereof are considered to be the same direction.

Referring to FIGS. 30 and 31, an active pattern 405 protruding form a substrate 400 may be formed. The substrate 400 may include a semiconductor material such as Si, Ge, Si—Ge, etc., a group III-V compound such as InP, GaP, GaAs, GaSb, etc., or the like or any combination thereof. In some embodiments, the substrate 400 may include an SOI substrate, a GOI substrate, or the like.

In example embodiments, the active pattern 405 may be formed by a shallow trench isolation (STI) process. For example, an upper portion of the substrate 400 may be partially etched to form an isolation trench, and then an insulation layer may be formed on the substrate 400 to fill the isolation trench. An upper portion of the insulation layer may be planarized by, e.g., a CMP process, until a top surface of the substrate 400 is exposed to form an isolation layer 402. The insulation layer may be formed of a material such as silicon oxide.

A plurality of protrusions may be formed from the substrate 400 and defined by the isolation layer 402. The protrusions may herein also be referred to as the active patterns 405. Each active pattern 405 may extend linearly in the first direction, and a plurality of the active patterns 405 may be formed along the second direction. In some embodiments, an ion-implantation process may be performed to form a well at an upper portion of an active pattern 405.

In some embodiments, an active pattern 405 may be formed from an additional channel layer. In this case, the channel layer may be formed on the substrate 400 by, e.g., a selective epitaxial growth (SEG) process, and an STI process may be performed on the channel layer to form the active pattern 405. While performing the SEG process, a silicon source such as silane may be used together with a germanium source or a carbon source so that a stress may be applied to the channel layer.

Referring to FIG. 32, an upper portion of the isolation layer 402 may be removed by, e.g., an etch-back process to expose an upper portion of the active pattern 405. Each exposed upper portion of the active pattern 405 may herein be defined as an active fin 407. As exemplarily illustrated, each active fin 407 may extend in the first direction, and a plurality of the active fins 407 may be arranged along the second direction.

Figure 34:
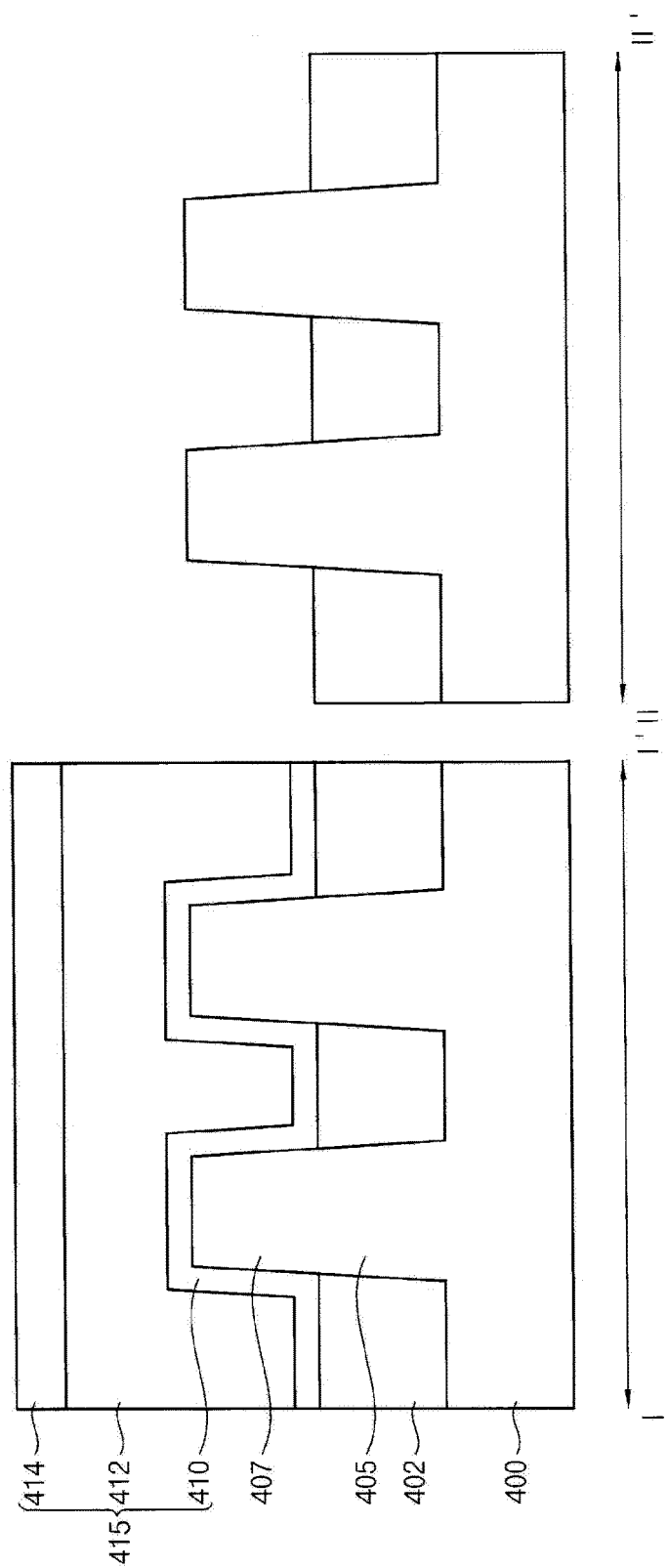
Figure 35:
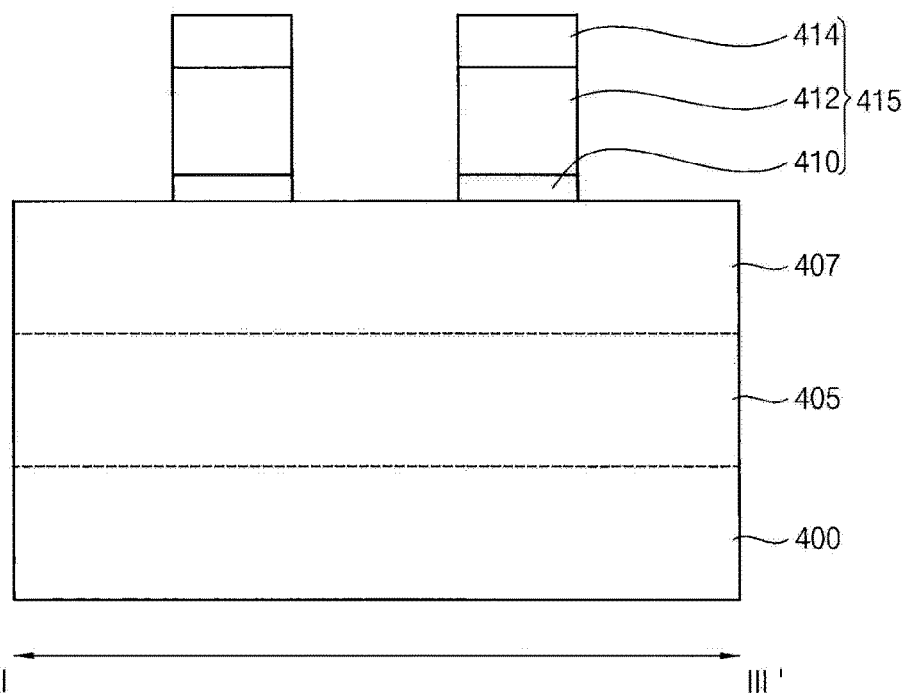
Figure 36:
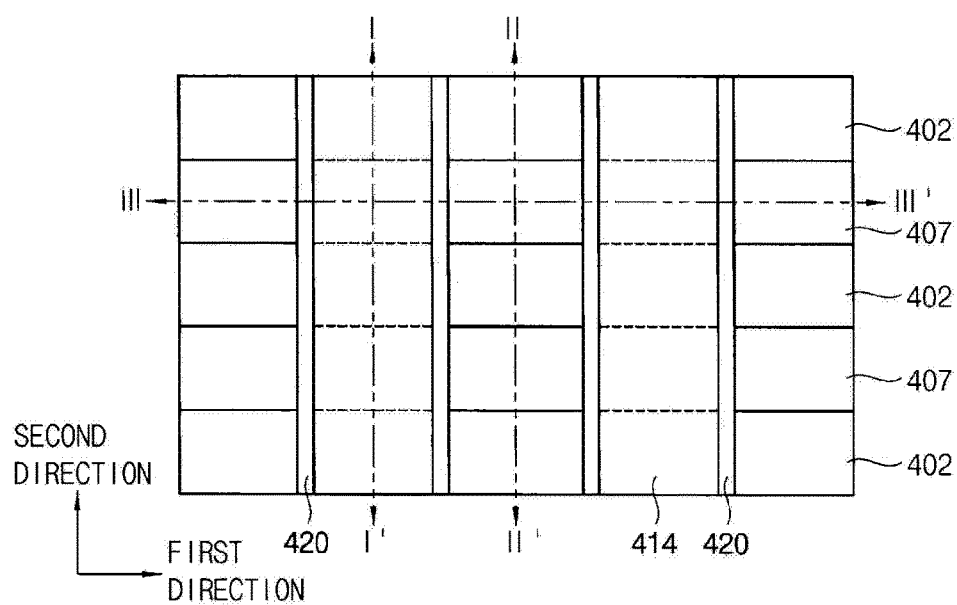

Referring to FIGS. 33, 34 and 35, a dummy gate structure 415 may be formed on the isolation layer 402 and the active fin 407. For example, a dummy gate insulation layer, a dummy gate electrode layer and a dummy gate mask layer may be sequentially formed on the active fin 407 and the isolation layer 402. The dummy gate mask layer may be patterned by a photo-lithography process to form a dummy gate mask 414. The dummy gate electrode layer and the dummy gate insulation layer may be partially removed using the dummy gate mask 414 as an etching mask to form the dummy gate structure 415.

The dummy gate structure 415 may include a dummy gate insulation pattern 410, a dummy gate electrode 412 and the dummy gate mask 414 sequentially stacked from the active fin 407 and the isolation layer 402. For example, the dummy gate insulation layer may be formed of silicon oxide. The dummy gate electrode layer may be formed of polysilicon. The dummy gate mask layer may be formed of silicon nitride. The dummy gate insulation layer, the dummy gate electrode layer and the dummy gate mask layer may be formed by a CVD process, a sputtering process or an ALD process. In an embodiment, the dummy gate insulation layer may be formed by a thermal oxidation process on the active fin 407. In this case, the dummy gate insulation layer may be selectively formed on a top surface of the active fin 407. In example embodiments, the dummy gate structure 415 may extend in the second direction, and may cross a plurality of the active fins 307. A plurality of the dummy gate structures 415 may be formed along the first direction.

Figure 37:
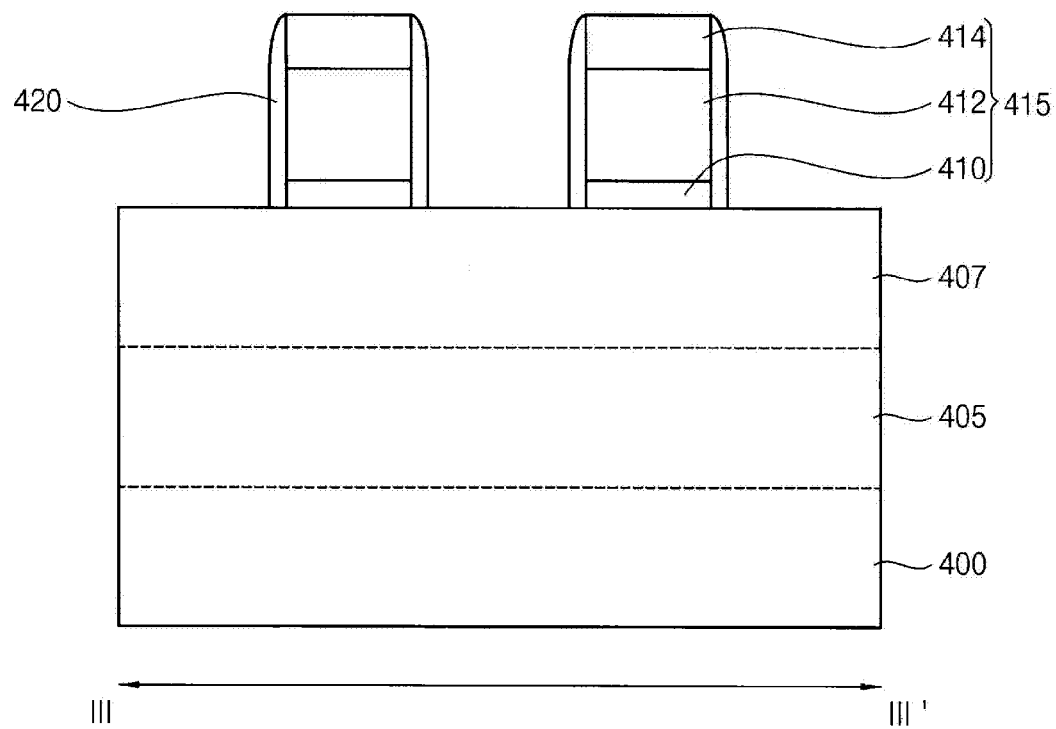

Referring to FIGS. 36 and 37, a gate spacer 420 may be formed on a sidewall of the dummy gate structure 415. As illustrated in FIG. 36, the gate spacer 420 may extend in the second direction together with the dummy gate structure 415. In example embodiments, the gate spacer 420 may be formed by forming a spacer layer on the dummy gate structure 415, the active fin 407 and the isolation layer 402, and anisotropically etching the spacer layer. The spacer layer may be formed of a nitride, e.g., silicon nitride, silicon oxynitride, silicon carbonitride, etc.

Figure 38:
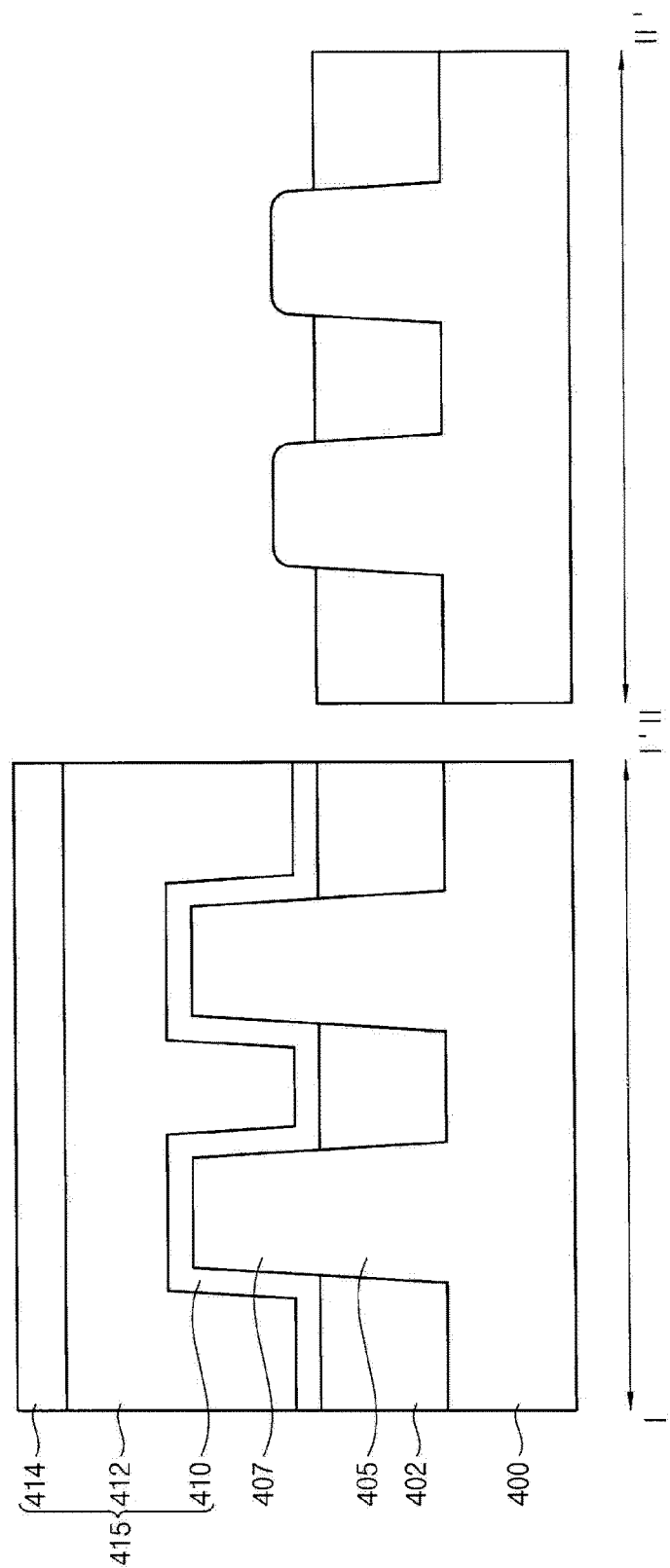
Figure 39:
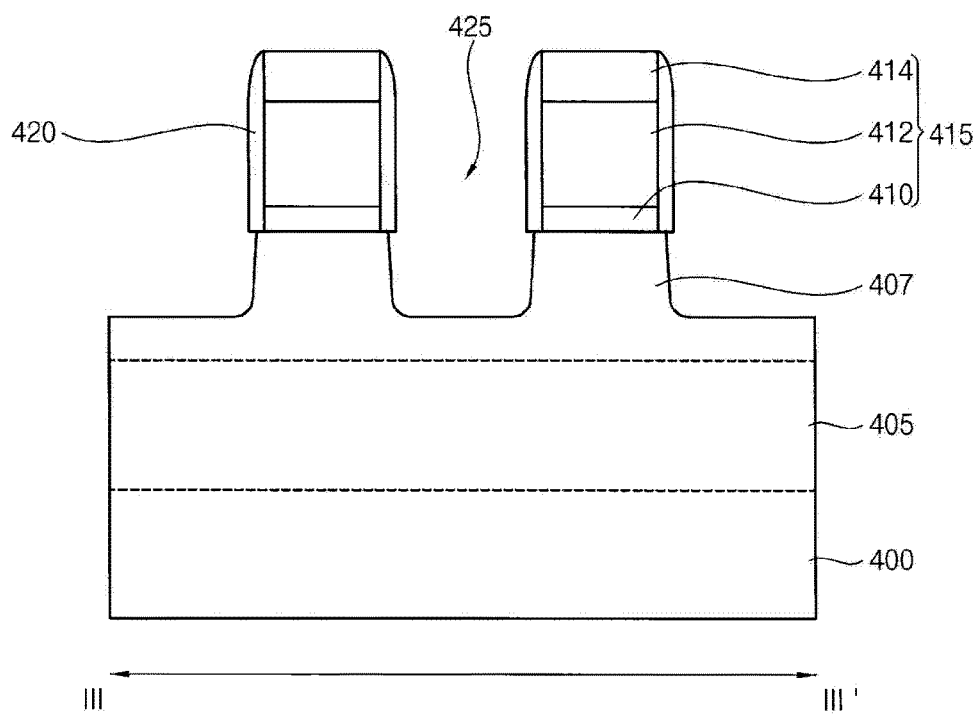

Referring to FIGS. 38 and 39, an upper portion of the active fin 407 adjacent to the gate spacer 420 and/or the dummy gate structure 415 may be etched to form a recess 425. During formation of the recess 425, the gate spacer 420 may substantially serve as an etching mask. In example embodiments, an inner wall of the recess 425 may have a substantially "U"-shaped profile, e.g., as illustrated in FIG. 39. In some embodiments, the recess 425 may be expanded to a portion of the active pattern 405 below the top surface of the isolation layer 402.

Figure 40:
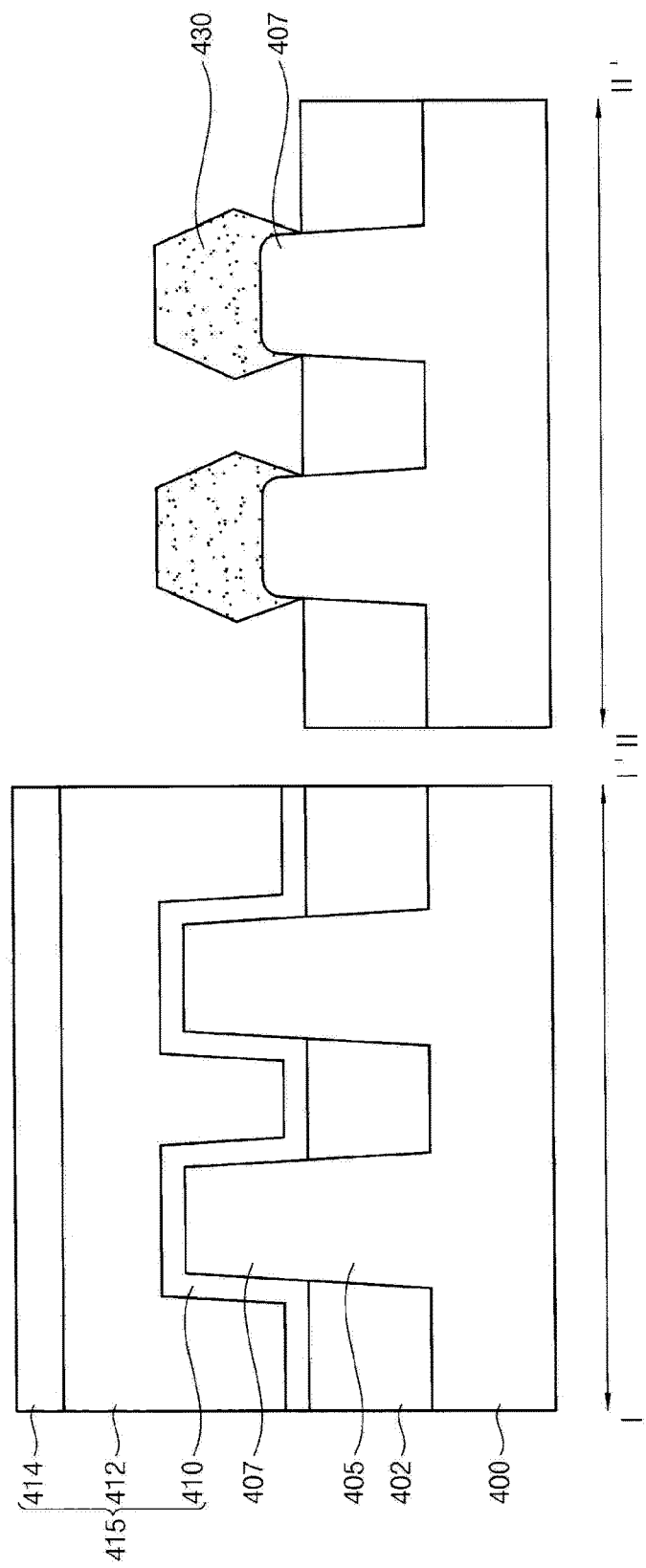
Figure 41:
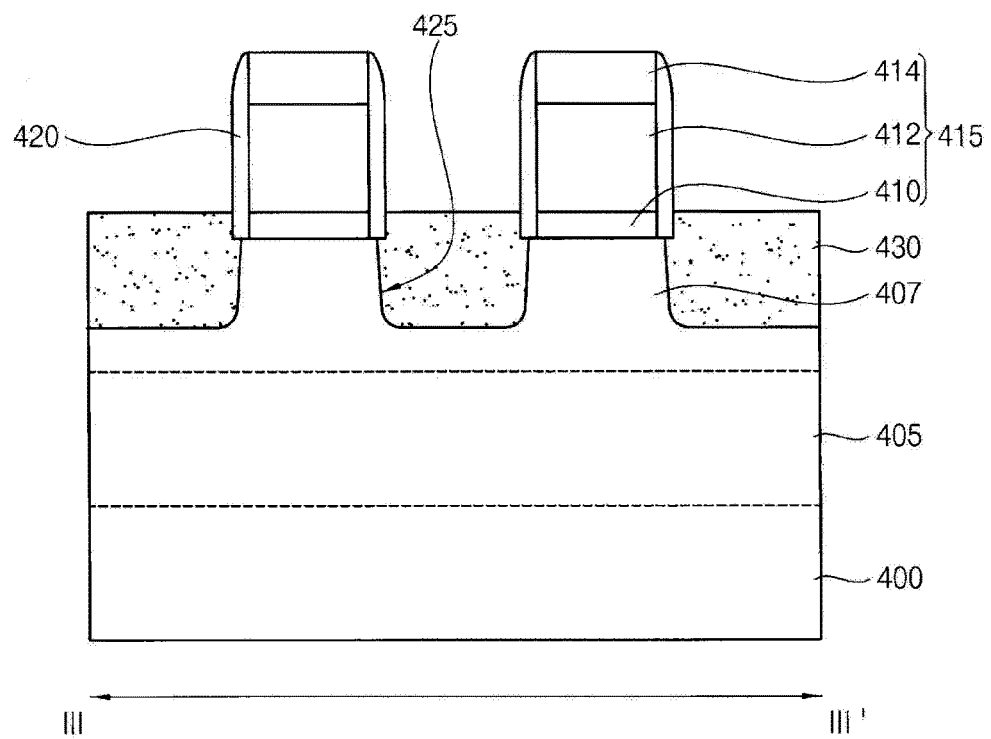

Referring to FIGS. 40 and 41, a source/drain layer 430 filling the recess 425 may be formed. In example embodiments, the source/drain layer 430 may be formed by an SEG process using a top surface of the active fin 407 exposed by the recess 425 as a seed.

In some embodiments, an n-type impurity source such as phosphine ($PH_3$) may be provided together with a silicon source such as silane in the SEG process. In this case, the source/drain layer 430 may serve as an impurity region of an NMOS-type FinFET. In an embodiment, a carbon source such as a hydrocarbon gas may be provided together with the silicon source. In this case, a tensile stress may be applied through the source/drain layer 430 to improve an electron mobility of an NMOS channel.

In some embodiments, a p-type impurity source such as diborane ($B_2H_6$) may be provided together with the silicon source in the SEG process. In this case, the source/drain layer 430 may serve as an impurity region of a PMOS-type FinFET. In an embodiment, a germanium source such as germane ($GeH_4$) or germanium tetrachloride ($GeCl_4$) may be provided together with the silicon source. In this case, a compressive stress may be applied through the source/drain layer 430 to improve a hole mobility of a PMOS channel.

The source/drain layer 430 may be grown vertically and laterally to have, e.g., a polygonal cross-section as illustrated in FIG. 40. In some embodiments, the source/drain layer 430 may sufficiently fill the recess 325 to contact a lower portion of the gate spacer 320. As illustrated in FIG. 40, one source/drain layer 430 is formed for each active fin 407. However, the one source/drain layer 430 may be formed from a plurality of the active fins 407. For example, two source/drain layers 430 neighboring one another in the second direction may be merged with each other.

Figure 42:
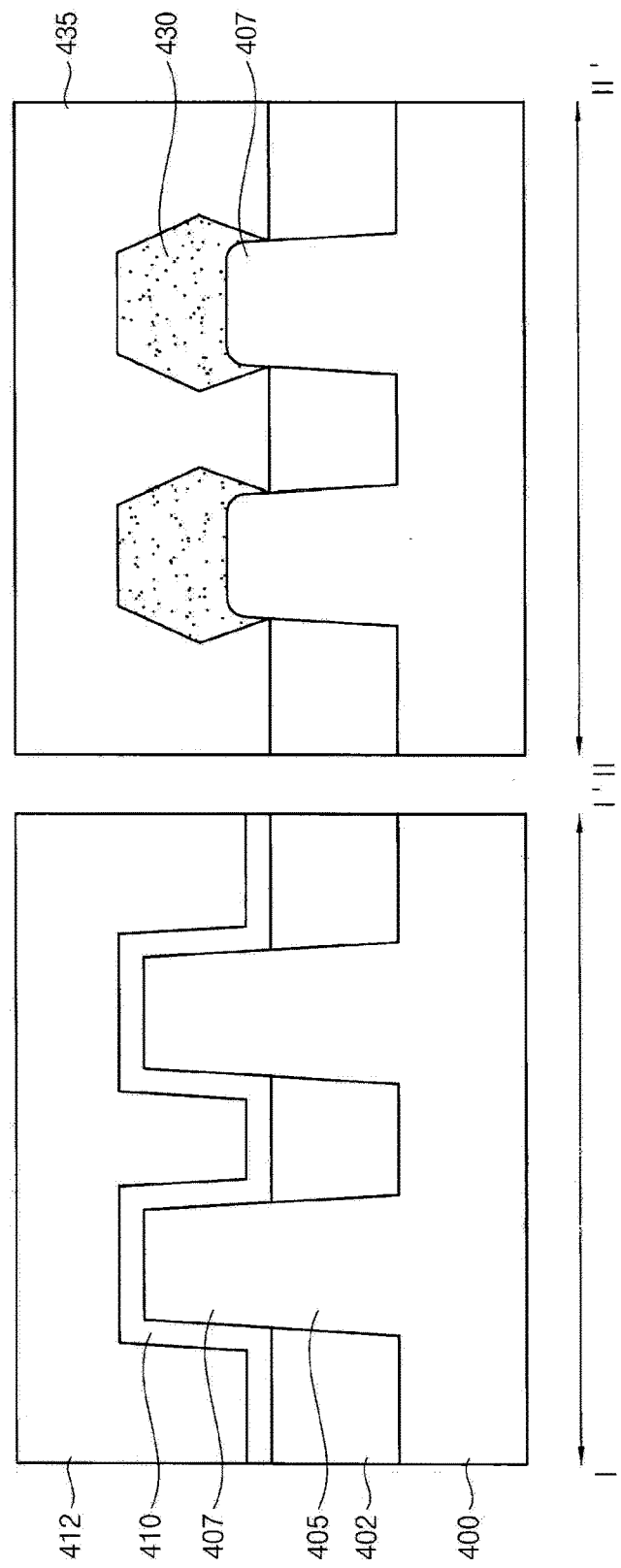
Figure 43:
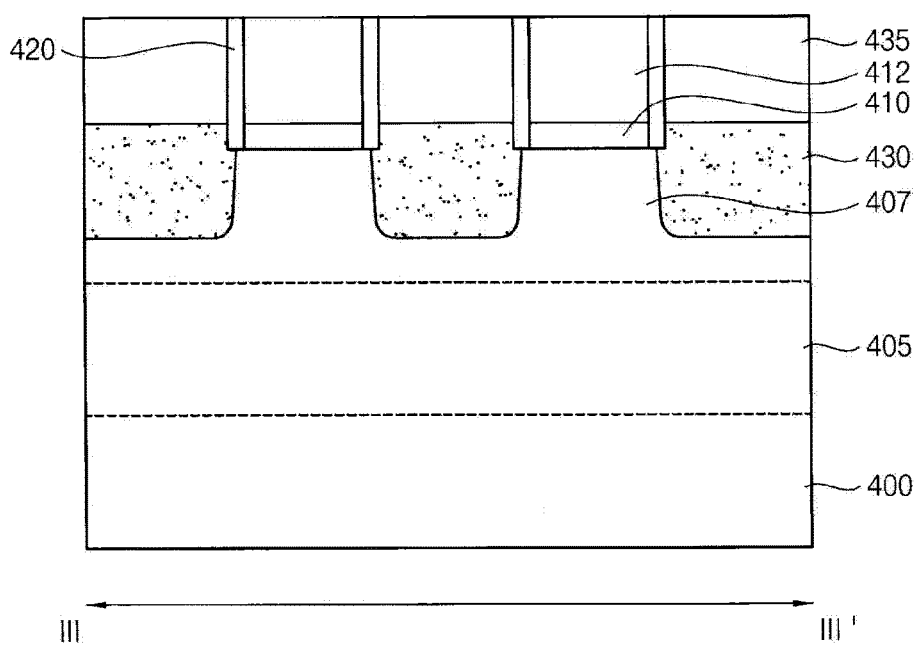

Referring to FIGS. 42 and 43, a first insulating interlayer 435 covering the dummy gate structure 415, the gate spacer 420 and the source/drain layers 430 may be formed on the active fin 407 and the isolation layer 402. An upper portion of the first insulating interlayer 435 may be planarized by a CMP process and/or an etch-back process until a top surface of the gate electrode 412 is exposed. In some embodiments, the dummy gate mask 414 may be removed by the CMP process, and an upper portion of the gate spacer 420 may be also partially removed. The first insulating interlayer 435 may be formed of, e.g., a silicon oxide-based material by a CVD process.

Figure 44:
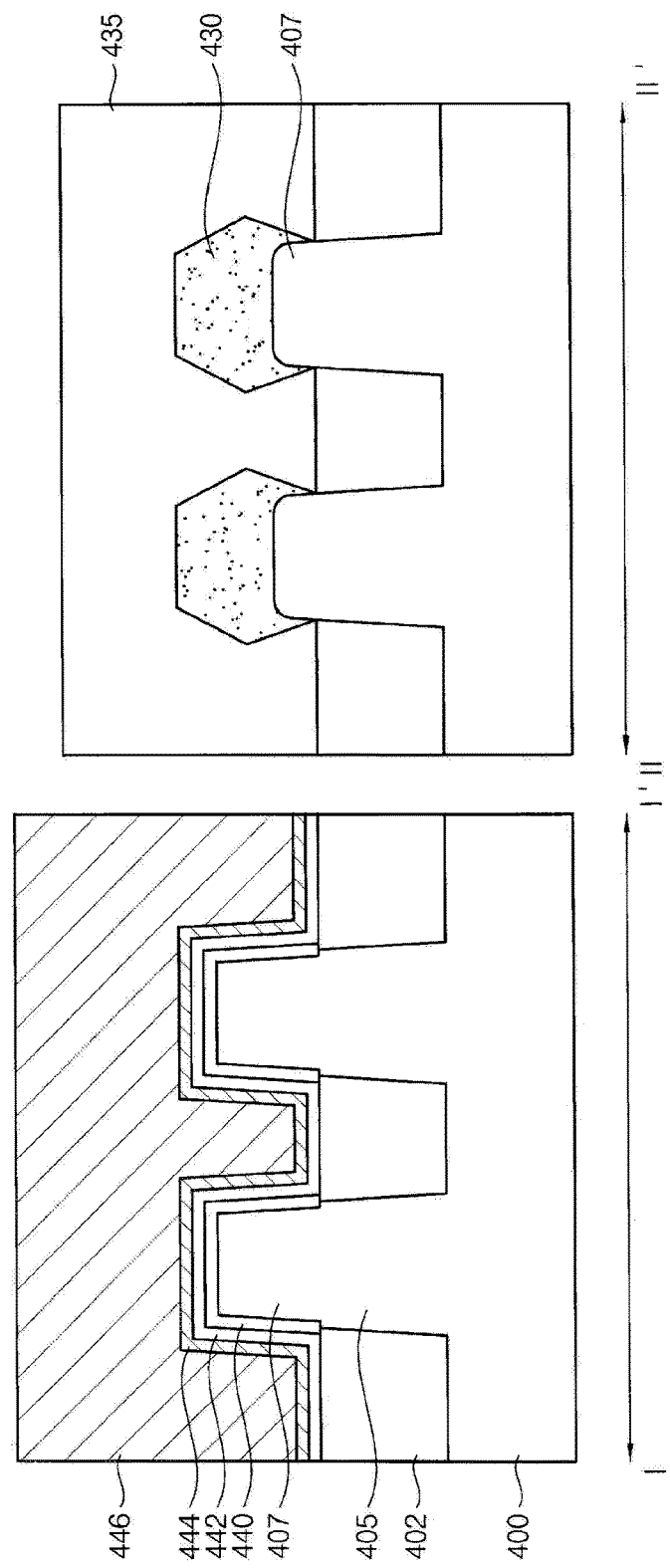
Figure 45:
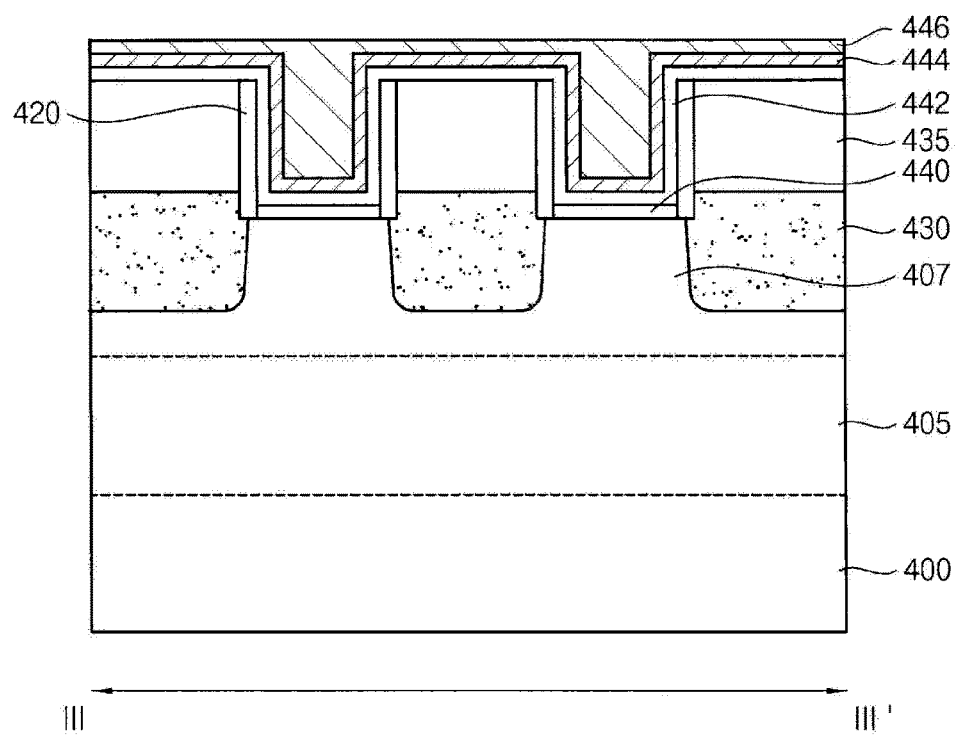

Referring to FIGS. 44 and 45, the dummy gate electrode 412 and the dummy gate insulation pattern 410 may be removed. Accordingly, a trench (not illustrated) exposing an upper portion of the active fin 407 may be formed between a pair of the gate spacers 420. The exposed active fin 407 may be thermally oxidized to form an interface layer 440. A gate insulation layer 442 may be formed along a top surface of the first insulating interlayer 435, an inner wall of the trench, and top surfaces of the interface layer 440 and the isolation layer 402, and a buffer layer 444 may be formed on the gate insulation layer 442. A gate electrode layer 446 filling a remaining portion of the trench may be formed on the buffer layer 444.

The gate insulation layer 442 may be formed of a metal oxide having a high dielectric constant (high-k) such as hafnium oxide, tantalum oxide and/or zirconium oxide. The buffer layer 444 may be included for adjusting a work function of a gate electrode. The buffer layer 444 may be formed of a metal nitride such as titanium nitride, tantalum nitride and/or aluminum nitride. The gate electrode layer 446 may be formed of a metal having a low electric constant such as aluminum, copper, tungsten, or the like.

The gate insulation layer 442, the buffer layer 444 and the gate electrode layer 446 may be formed by a process such as a CVD process, an ALD process, a PVD process, etc. In some embodiments, the interface layer 440 may be also formed by a deposition process such as a CVD process or an ALD process. In this case, the interface layer 440 may have a profile that is the same as (or substantially the same as or similar to that of) the gate insulation layer 442.

Figure 46:
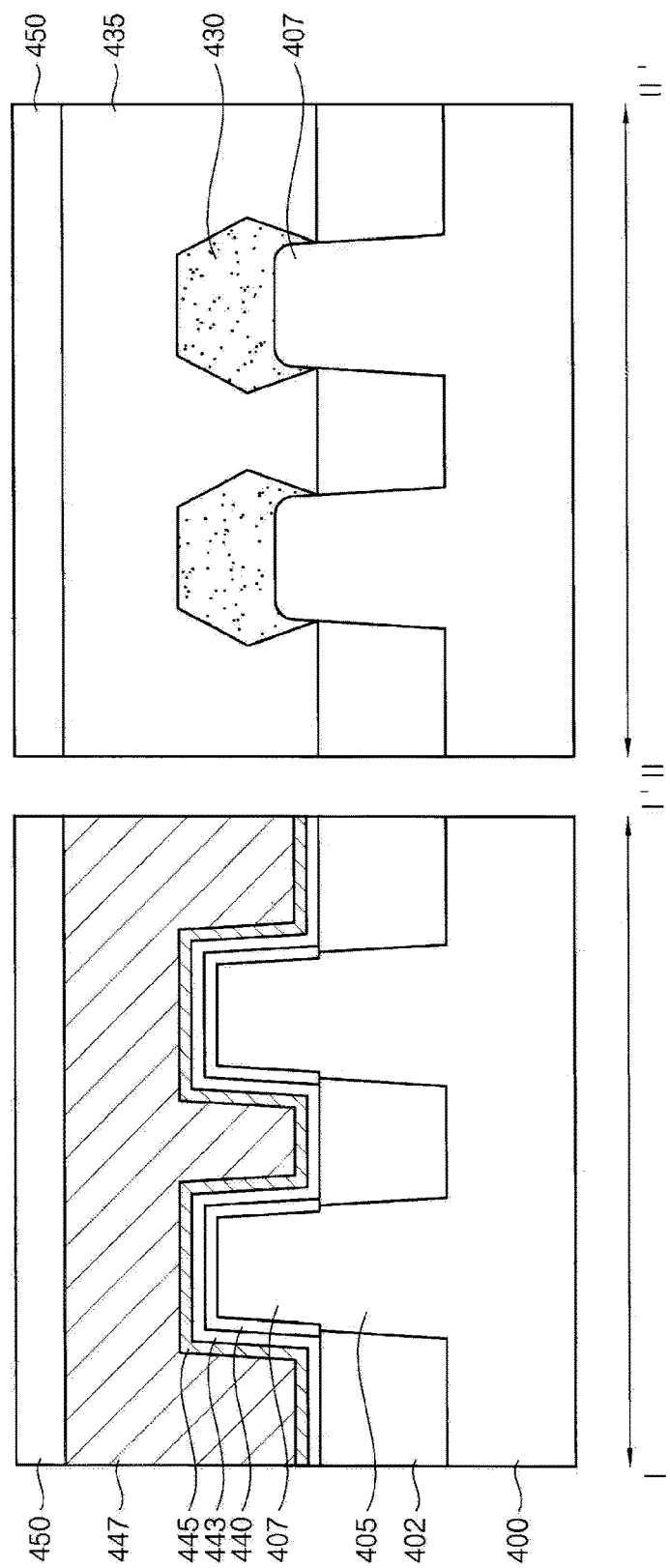
Figure 47:
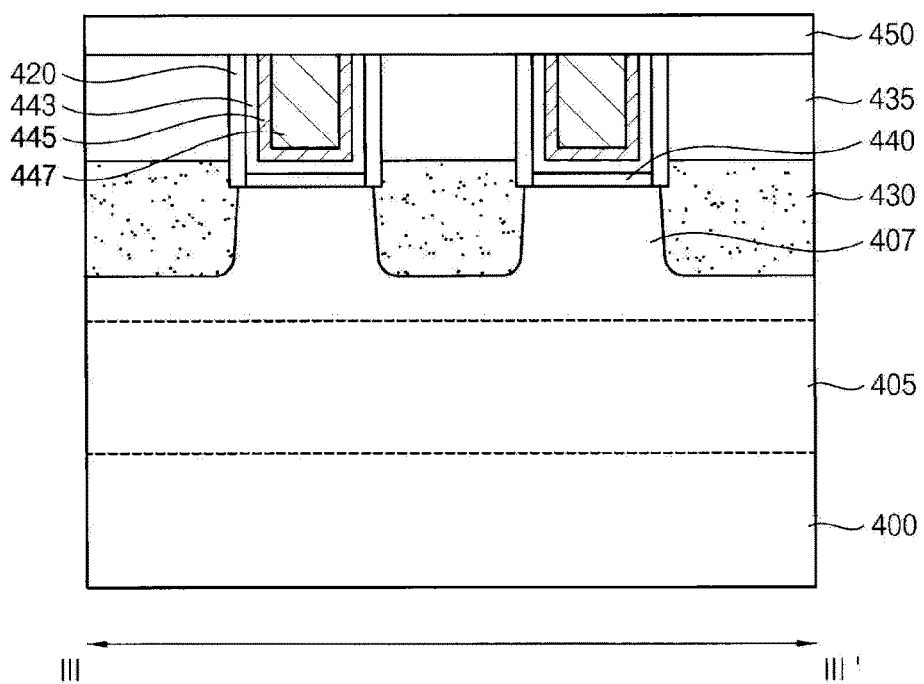

Referring to FIGS. 46 and 47, upper portions of the gate electrode layer 446, the buffer layer 444 and the gate insulation layer 442 may be planarized by, e.g., a CMP process until the top surface of the first insulating interlayer 435 may be exposed. After the planarization process, a gate structure including the interface layer 440, a gate insulation pattern 443, a buffer pattern 445 and a gate electrode 447 may be defined in the trench. An NMOS transistor or a PMOS transistor having a FinFET structure may thus be defined by the gate structure and the source/drain layer 430.

A passivation layer 450 may be formed on the first insulating interlayer 435, the gate spacers 420 and the gate structure. The passivation layer 450 may be formed of a nitride-based material such as silicon nitride or silicon oxynitride by a CVD process. A portion of the passivation layer 450 covering the gate structure may serve as a gate mask.

Figure 48:
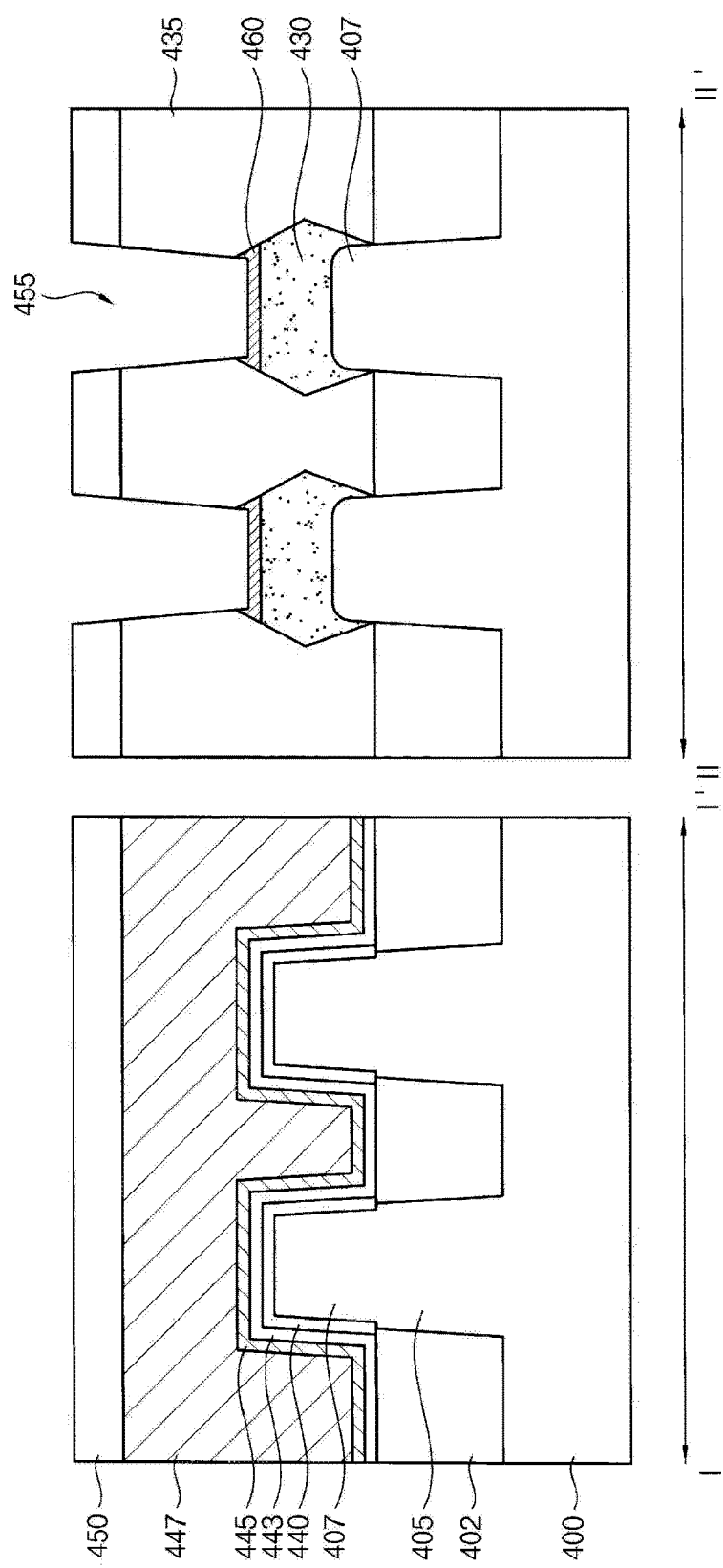
Figure 49:
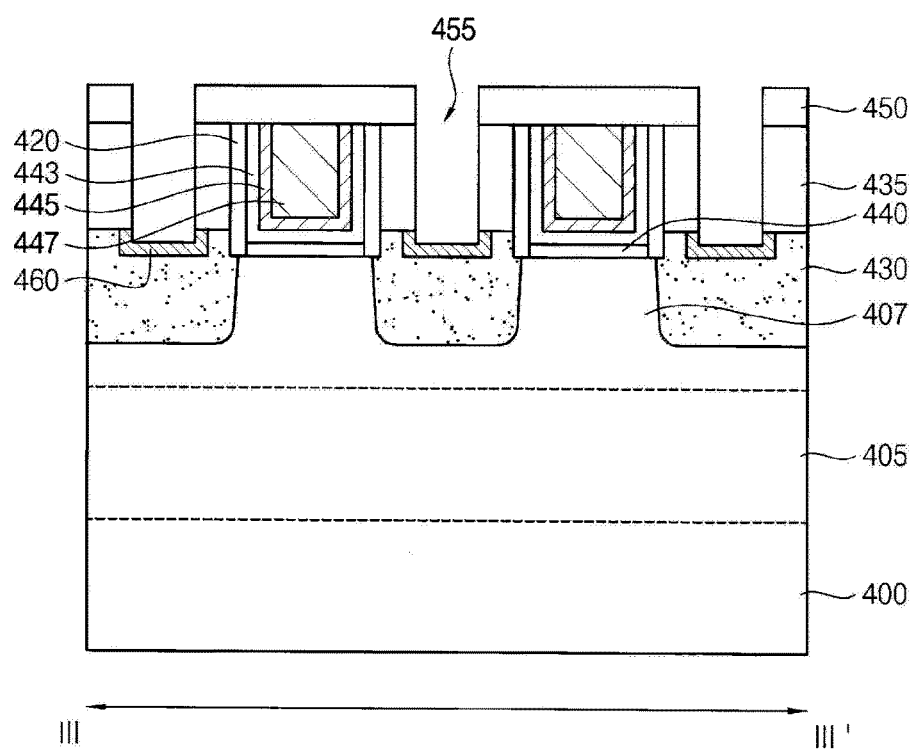

Referring to FIGS. 48 and 49, the passivation layer 450 and the first insulating interlayer 435 may be partially etched to form a contact hole 455 through which the source/drain layer 430 is exposed. In some embodiments, while performing the etching process to form the contact hole 455, an upper portion of the source/drain layer 430 may be partially removed. Accordingly, the contact hole 455 may extend into an upper portion of the source/drain layer 430.

In example embodiments, a silicide layer 460 may be formed at the upper portion of the source/drain layer 430 that is exposed through the contact hole 455. For example, a metal layer (e.g., formed of cobalt, nickel, etc.) may be formed on a portion of the source/drain layer 430 that is exposed through the contact hole 455, and then a thermal treatment such as an annealing process may be performed to transform a portion of the metal layer contacting the source/drain layer 430 into a metal silicide (e.g., cobalt silicide, nickel silicide, etc.). An unreacted portion of the metal layer may be removed, thereby forming the silicide layer 460.

As illustrated in FIG. 48, one source/drain layer 430 may be exposed by one contact hole 455. In some embodiments, however, a plurality of the source/drain layers 430 may be exposed by a common contact hole 455. For example, at least two source/drain layers 430 neighboring each other may be exposed by the contact hole 455, which extends in the second direction.

Figure 50:
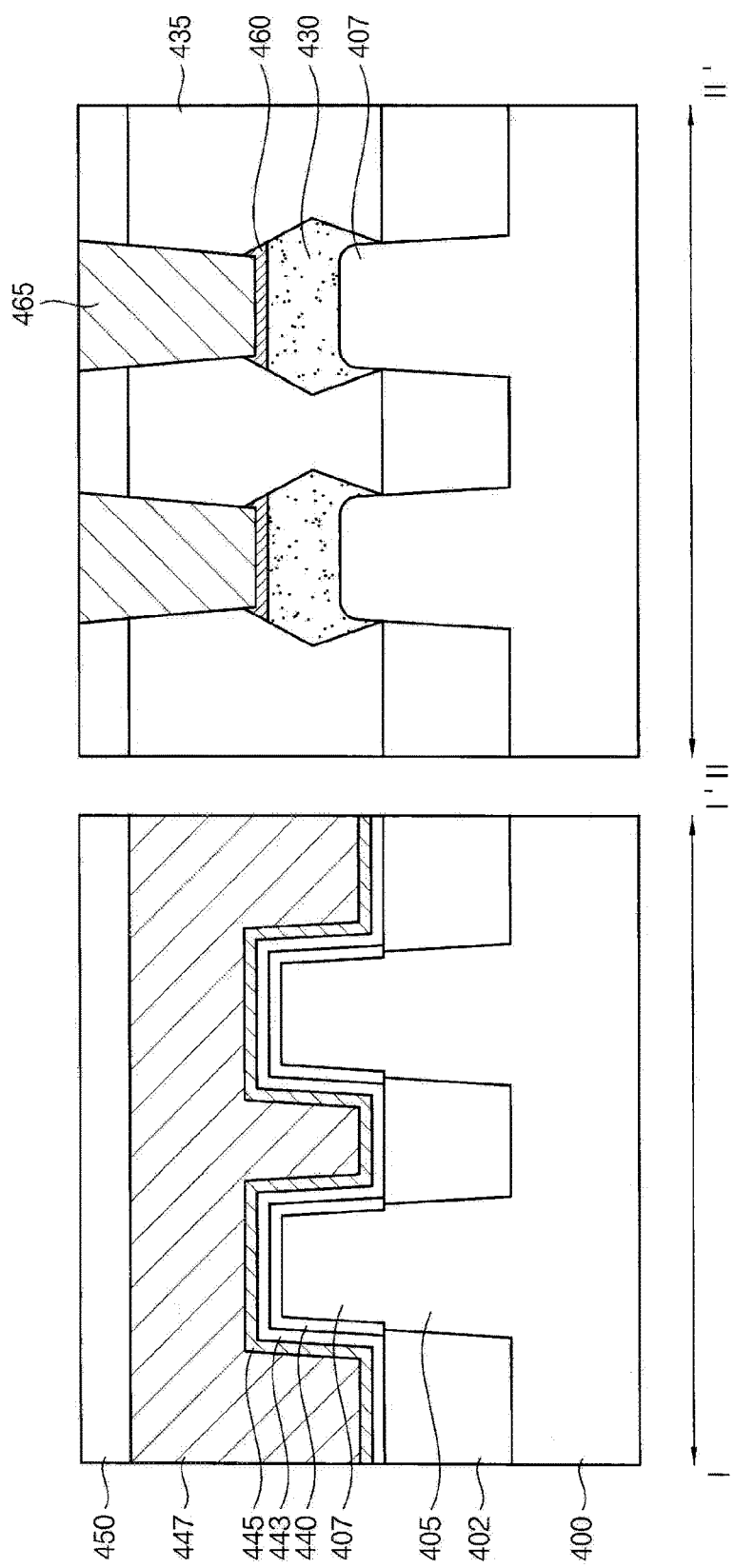
Figure 51:
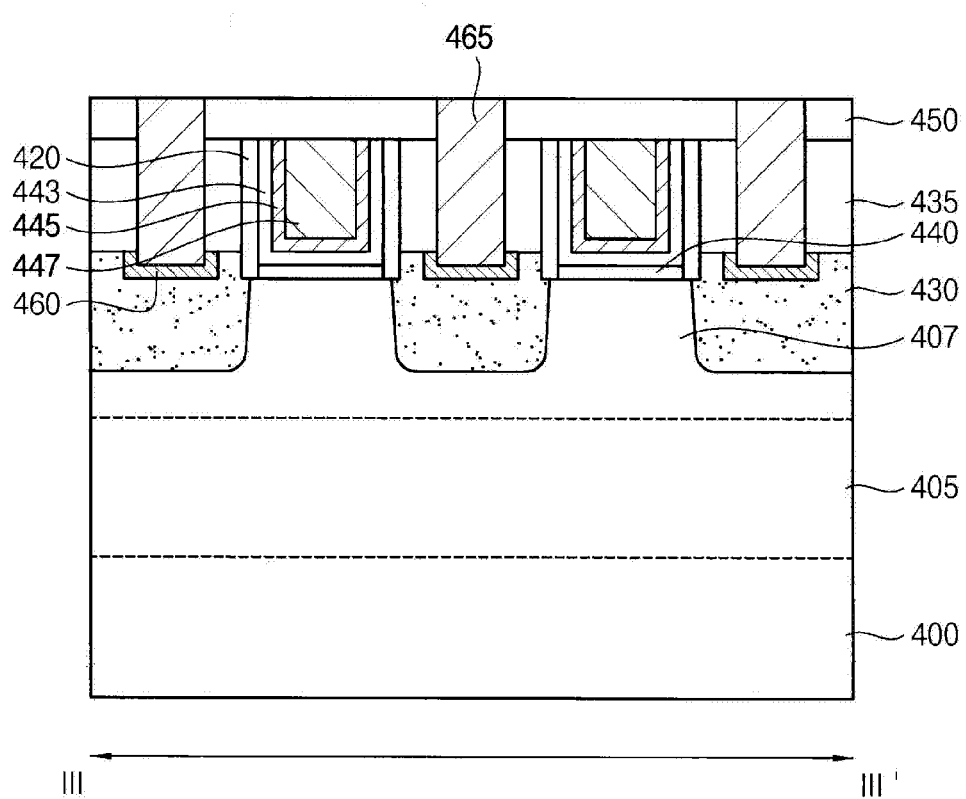

Referring to FIGS. 50 and 51, a plug 465 electrically connected to the source/drain layer 430 may be formed in the contact hole 455. For example, a conductive layer sufficiently filling the contact holes 455 may be formed on the passivation layer 450. An upper portion of the conductive layer may be planarized by a CMP process until a top surface of the passivation layer 450 may be exposed to form the plugs 465. The conductive layer may be formed of a metal, a metal nitride or a doped polysilicon. In some embodiments, a barrier layer including a metal nitride such as titanium nitride may be formed along an inner wall of the contact hole 455 before forming the conductive layer. The plug 465 may contact the silicide layer 460. Thus, an electrical resistance between the plug 465 and the source/drain layer 430 may be reduced due to the presence of the silicide layer 460. In some embodiments, the plug 465 may extend in the second direction, and may be electrically connected to a plurality of the source/drain layers 430.

Figure 52:
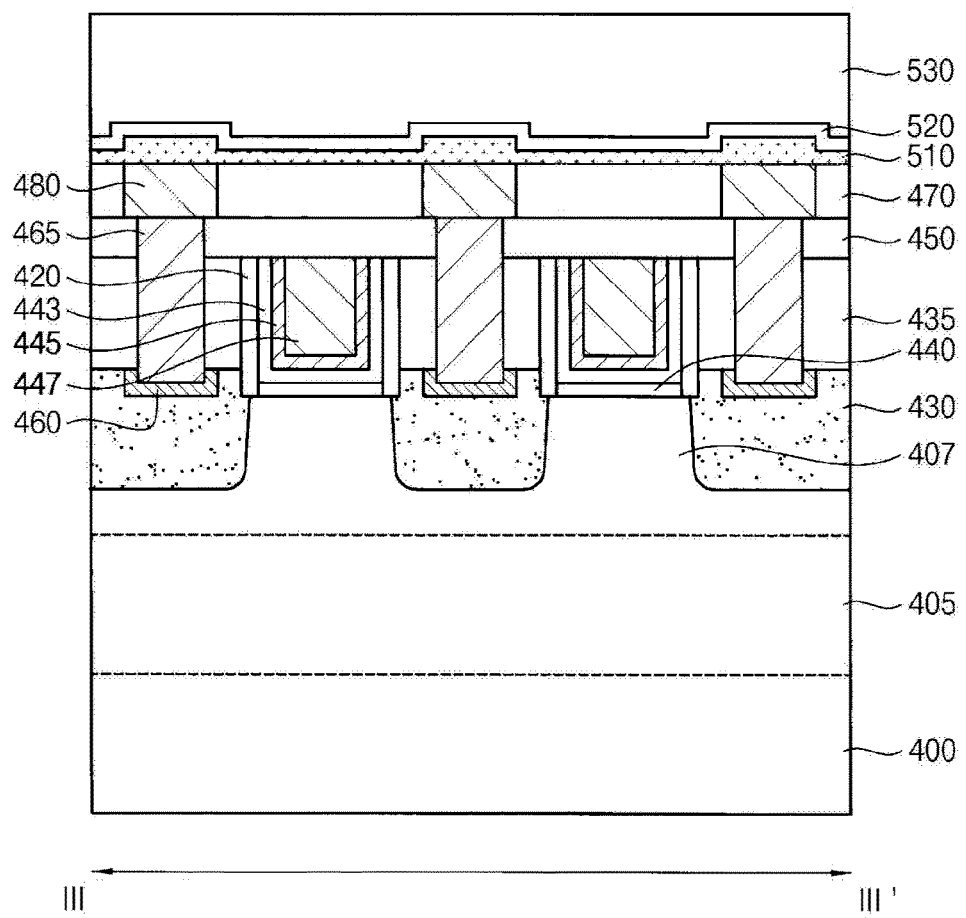

Referring to FIG. 52, a lower insulation layer 470 and a lower wiring 480 may be formed on the passivation layer 460 and the plug 465 by a process substantially the same as or similar to that illustrated with reference to FIG. 1. Subsequently, a back-end-of-line (BEOL) process, substantially the same as or similar to those illustrated with reference to FIGS. 1 to 8, FIGS. 11 to 17, FIGS. 18 to 23, and/or FIGS. 24 to 29, may be performed.

For example, processes substantially the same as or similar to those described above with reference to FIGS. 2 to 4 may be performed. In example embodiments, a multi-layered etch-stop layer, e.g., including a first etch-stop layer 510 and a second etch-stop layer 520, may be formed on the lower insulation layer 470 and the lower wiring 480. A second insulating interlayer 530 may be formed on the etch-stop layer.

As described above, the first etch-stop layer 510 may be formed of a metallic dielectric material such as aluminum nitride. The first etch-stop layer 510 may be formed to be thicker on the lower wiring 480 due to an affinity between metal components of the lower wiring 480 and the metal precursor or target used to form the first etch-stop layer 510. The second etch-stop layer 520 may be formed of a non-metallic dielectric material such as silicon carbide or silicon oxycarbide, and may be formed conformally along a profile of the first etch-stop layer 510. The second insulating interlayer 530 may be formed of a low-k silicon oxide-based material.

Figure 53:
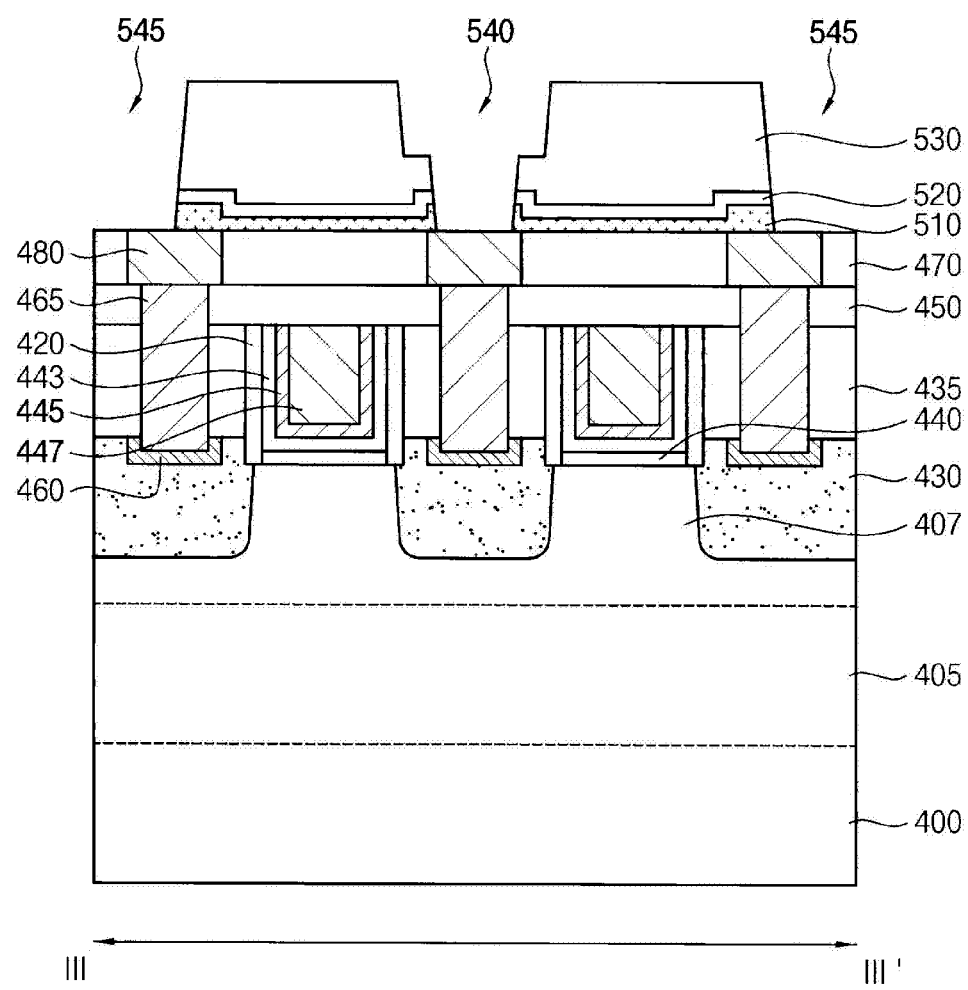

Referring to FIG. 53, the second insulating interlayer 530 and the etch-stop layer may be sequentially and partially etched to form openings, such as a first opening 540 and a second opening 545, exposing top surfaces of the lower wirings 480. The first opening 540 may, for example, be formed by a dual damascene process, and may include a via hole and a trench at a lower portion and at an upper portion thereof, respectively. The top surface of the lower wiring 480 may be exposed by the via hole, and a bottom of the via hole may be defined by the top surface of the lower wiring 480. The etch-stop layer may be relatively thick on the lower wiring 480 so that a damage of the lower wiring 480 may be prevented while forming the first opening 540. The second opening 545 may, for example, partially expose the top surface of the lower wiring 480 and a top surface of the lower insulation layer 470. A sufficient etching selectivity between the lower insulation layer 470 and the first etch-stop layer 510 may be achieved so that the second opening 545 may be formed without damaging the lower insulation layer 470.

Figure 54:
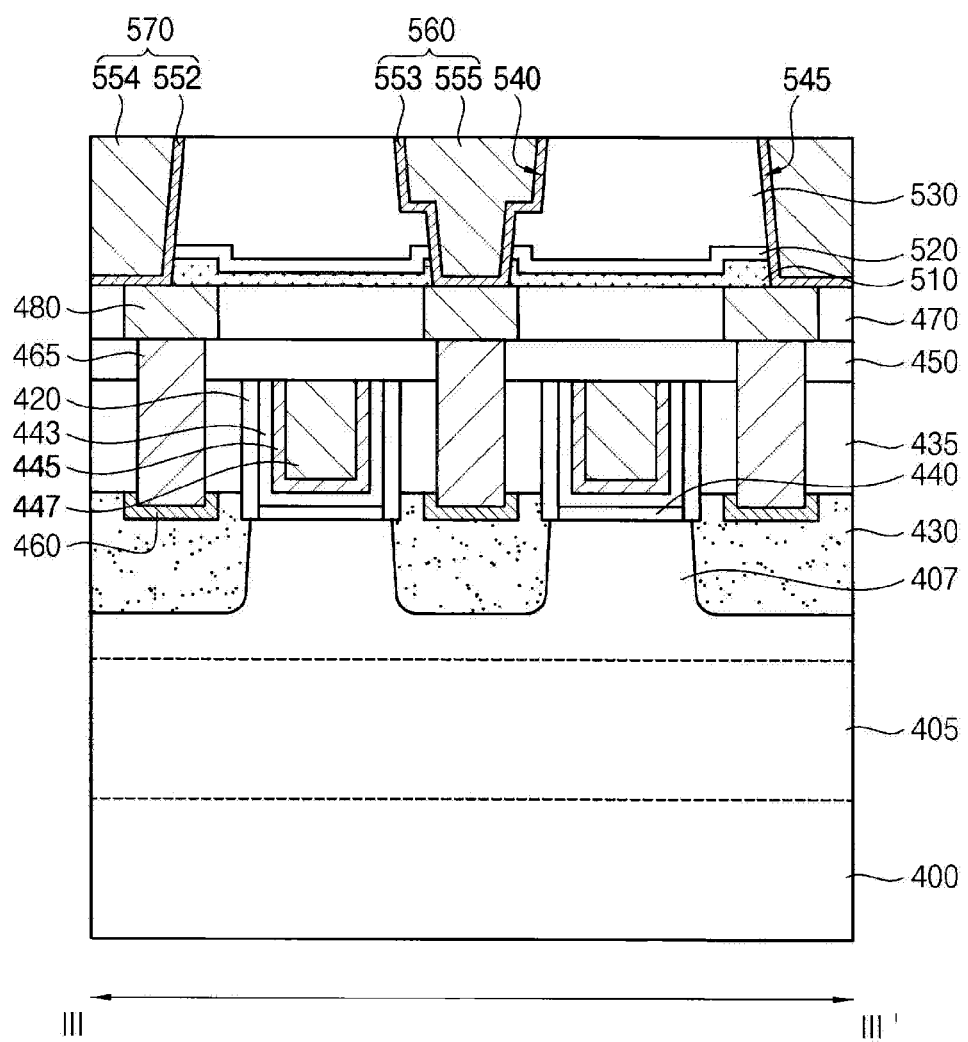

Referring to FIG. 54, processes substantially the same as or similar to those described above with reference to FIGS. 7 and 8 may be performed. For example, a barrier conductive layer may be formed along sidewalls and bottoms of the first and second openings 540 and 545, and a top surface of the second insulating interlayer 530. A metal layer sufficiently filling the first and second openings 540 and 545 may be formed on the barrier conductive layer. Upper portions of the barrier conductive layer and the metal layer may be planarized by a CMP process to form a first conductive pattern 560 and a second conductive pattern 570 in the first opening 540 and the second opening 545, respectively.

The first conductive pattern 560 may include a first barrier pattern 553 and a first metal pattern 555 sequentially formed on an inner wall of the first opening 540. The first conductive pattern 560 may extend through the second insulating interlayer 530, the second etch-stop layer 520 and the first etch-stop layer 510 to be landed on the top surface of the lower wiring 480. A via portion of the first conductive pattern 560 may be superimposed on the lower wiring 480 in a substantially vertical direction, and may not contact the top surface of the lower insulation layer 470.

The second conductive pattern 570 may include a second barrier pattern 552 and a second metal pattern 554 sequentially formed on an inner wall of the second opening 545. A bottom of the second conductive pattern 570 may contact a portion of the top surface of the lower wiring 480, and may also contact the top surface of the lower insulation layer 470. The bottom of the second conductive pattern 570 may be staggered with the top surface of the lower wiring 480.

According to example embodiments described above, a multi-layered etch-stop layer including different types of materials may be utilized in the BEOL process for a FinFET device including a gate structure of a fine line width, e.g., below about 20 nm or 10 nm Therefore, a dielectric constant or a permittivity between wirings may be reduced without damaging a lower structure to improve an operational property of the FinFET device.

The wiring structure and methods of forming the wiring structure may be also applied to a logic device including the FinFET structure, a volatile memory device such as an SRAM device or a DRAM device, or a non-volatile memory device such as a flash device, a PRAM device, an MRAM device, an RRAM device, etc.

According to example embodiments described above, a multi-layered etch-stop layer may include a first etch-stop layer and a second etch-stop layer, where the first-etch-stop layer may include, e.g., a metal nitride and the second etch-stop layer may include, e.g., an inorganic insulation material such as silicon carbide. The first etch-stop layer may be formed to be thicker on a lower conductive pattern than on a lower insulation layer due to an affinity between metal components of the lower conductive pattern and a metal precursor or target used to form the first etch-stop layer. Thus, an increase of a dielectric constant by the multi-layered etch-stop layer may be prevented. Further, the multi-layered etch-stop layer may include different types of materials to improve an etching selectivity. Therefore, an opening for a formation of a wiring may be formed without damaging the lower insulation layer and/or the lower conductive pattern.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A wiring structure, comprising:
    a substrate;
    a lower insulation layer on the substrate;
    a lower wiring in the lower insulation layer;
    a multi-layered etch-stop layer covering the lower wiring and the lower insulation layer, wherein a thickness of the multi-layered etch-stop layer over the lower wiring is greater than a thickness of the multi-layered etch-stop layer over the lower insulation layer, the multi-layered etch-stop layer including:
        a first etch-stop layer covering the lower wiring and including a metallic dielectric material, wherein the first etch-stop layer includes a first portion formed on the lower wiring and a second portion formed on the lower insulation layer, and wherein the first portion is thicker than the second portion; and
        a second etch-stop layer on the first etch-stop layer and the lower insulation layer;
    an insulating interlayer on the second etch-stop layer; and
    a conductive pattern extending through the insulating interlayer, the second etch-stop layer and the first etch-stop layer to be electrically connected to the lower wiring.

2. The wiring structure of claim 1, wherein the first etch-stop layer includes a dielectric metal nitride.

3. The wiring structure of claim 1, wherein the second etch-stop layer includes a non-metallic dielectric material.

4. The wiring structure of claim 3, wherein the second etch-stop layer includes at least one selected from the group consisting of silicon oxide, silicon carbide, silicon nitride, silicon oxynitride, silicon carbonitride and silicon oxycarbide.

5. The wiring structure of claim 1, wherein the first etch-stop layer continuously extends on the lower wiring and the lower insulation layer.

6. The wiring structure of claim 1, wherein the second etch-stop layer has a uniform thickness along the first portion and the second portion of the first etch-stop layer.

7. The wiring structure of claim 1, wherein the conductive pattern extends commonly through the first portion and the second portion of the first etch-stop layer, and
    the conductive pattern contacts top surfaces of the lower wiring and the lower insulation layer.

8. The wiring structure of claim 7, wherein the conductive pattern partially overlaps the top surface of the lower wiring and is staggered with the lower wiring.

9. The wiring structure of claim 1, wherein the first etch-stop layer is selectively formed on a top surface of the lower wiring with respect to the top surface of the lower insulation layer.

10. The wiring structure of claim 9, wherein the conductive pattern is landed on the top surface of the lower wiring, and
    a bottom of conductive pattern contacts the top surface of the lower wiring.

11. The wiring structure of claim 1, wherein a top portion of the second etch-stop layer contacts the conductive pattern and is higher than a top surface of the second etch-stop layer over the lower insulation layer.

12. A wiring structure, comprising:
    a substrate;
    a lower insulation layer on the substrate;
    a lower wiring in the lower insulation layer;
    a first etch-stop layer covering the lower wiring and the lower insulation layer, the first etch-stop layer being relatively thicker on the lower wiring than on the lower insulation layer;
    a second etch-stop layer on the first etch-stop layer, the second etch-stop layer including a material different from that of the first etch-stop layer;
    an insulating interlayer on the second etch-stop layer; and
    a conductive pattern extending through the insulating interlayer, the second etch-stop layer and the first etch-stop layer and electrically connected to the lower wiring.

13. The wiring structure of claim 12, wherein the first etch-stop layer includes a metallic dielectric material, and the second etch-stop layer includes a non-metallic dielectric material.

14. The wiring structure of claim 13, wherein the first etch-stop layer includes aluminum nitride, and the second etch-stop layer includes silicon carbide or silicon oxycarbide.

15. The wiring structure of claim 12, wherein the conductive pattern contacts top surfaces of the lower wiring and the lower insulation layer.

16. The wiring structure of claim 12, wherein a top portion of the second etch-stop layer contacts the conductive pattern and is higher than a top surface of the second etch-stop layer over the lower insulation layer.

17. A wiring structure, comprising:
a substrate;
a lower insulation layer on the substrate;
a lower wiring in the lower insulation layer;
a multi-layered etch-stop layer covering the lower insulation layer and the lower wiring and having a first etch-stop layer covering a peripheral portion of the lower wiring and the lower insulation layer and a second etch-stop layer on the first etch-stop layer, wherein a top surface of the first etch-stop layer on the lower wiring is higher than a top surface of the first etch-stop layer on the lower insulation layer and a top surface of the second etch-stop layer over the lower wiring is higher than a top surface of the second etch-stop layer over the lower insulation layer;
an insulating interlayer on the second etch-stop layer; and
a conductive pattern extending through the insulating interlayer and the multi-layered etch-stop layer such that the conductive pattern is enclosed by the insulating interlayer and the multi-layered etch-stop layer and electrically connected to the lower wiring.

18. The wiring structure of claim 17, wherein a top surface of the conductive pattern is coplanar with a top surface of the insulating interlayer.

19. The wiring structure of claim 17, wherein the wiring structure includes a pair of lower wirings that are adjacent to one another and wherein the first etch-stop layer has a same thickness on the pair of lower wirings and a thickness of the first etch-stop layer on the lower wiring is greater than a thickness of the first etch-stop layer on the lower insulation layer.

20. The wiring structure of claim 17, wherein a top portion of the second etch-stop layer contacts the conductive pattern and is higher than a top surface of the second etch-stop layer over the lower insulation layer.

* * * * *